US007332813B2

(12) United States Patent
Ueno

(10) Patent No.: US 7,332,813 B2
(45) Date of Patent: Feb. 19, 2008

(54) SEMICONDUCTOR DEVICE

(75) Inventor: Kazuyoshi Ueno, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/609,952

(22) Filed: Jun. 30, 2003

(65) Prior Publication Data

US 2004/0004289 A1 Jan. 8, 2004

(30) Foreign Application Priority Data

Jul. 4, 2002 (JP) ............................ 2002-195997

(51) Int. Cl.
*H01L 23/48* (2006.01)

(52) U.S. Cl. ...................... 257/762; 257/752; 257/751; 257/E23.161

(58) Field of Classification Search ........ 257/750-753, 257/762, 763, 761, 767, 758, E23.161; 438/652-654, 438/687
See application file for complete search history.

(56) References Cited

U.S. PATENT DOCUMENTS

| | | | | |
|---|---|---|---|---|
| 6,063,506 A * | 5/2000 | Andricacos et al. | ........ | 428/546 |
| 6,147,408 A * | 11/2000 | Ogure et al. | ................ | 257/762 |
| 6,291,082 B1 * | 9/2001 | Lopatin | ...................... | 428/621 |
| 6,465,889 B1 * | 10/2002 | Subramanian et al. | ...... | 257/760 |
| 6,696,761 B2 * | 2/2004 | Chan et al. | ................. | 257/762 |
| 6,723,635 B1 * | 4/2004 | Ngo et al. | .................. | 438/627 |

FOREIGN PATENT DOCUMENTS

| | | |
|---|---|---|
| JP | 11-204524 | 7/1999 |
| JP | 2000-349085 | 12/2000 |

OTHER PUBLICATIONS

Chinese Patent Office Action of Apr. 28, 2006.
English Translation of the above-referenced Chinese Office Action, Apr. 28, 2006.

* cited by examiner

*Primary Examiner*—Matthew C. Landau
(74) *Attorney, Agent, or Firm*—Darryl G. Walker

(57) ABSTRACT

A semiconductor device with a metallic region can have a resistance to stress migration and increased reliability. A lower layer wiring made from a barrier metal film (102) and a copper containing metallic film (103) can be formed within an insulating film (101). An interlayer insulating film (104 or 104*a* and 104*b*) can be formed thereon. An upper layer wiring made from a barrier metal film (106 or 106*a* and 106*b*) and a copper containing metallic film (111 or 111*a* and 111*b*) is formed within the interlayer insulating film (104 or 104*a* and 104*b*). A silver containing metallic protective film (108*a* and 108*b*) can be formed on surfaces of the lower layer wiring and upper layer wiring.

12 Claims, 12 Drawing Sheets

(a)

108b 111 106

104

101

103 102 108a (b)

108b 111b 106b 106a
104b
111a
104a
101

103 102 108a (a)

(b)

(a)

(b)

SEMICONDUCTOR DEVICE

TECHNICAL FIELD

The present invention relates generally to a semiconductor device, and more particularly to a semiconductor device having a metallic region, and a method of manufacturing the same.

BACKGROUND OF THE INVENTION

With the recent demand for very highly integrated circuit devices, copper has become more widely used as a wiring and/or plug material. Copper has the advantageous characteristics of lower resistance and superior electromigration resistance, as compared to aluminum, which has enjoyed wide use up to now.

However, as miniaturization of device elements has progressed, electromigration (hereinafter referred to as "EM") has become a problem even for wiring made from copper. A copper wiring is typically formed from a copper film formed by a plating method, or the like. In such a case, a resulting copper film has a polycrystalline-structure of aggregate copper grains. If a voltage is applied across a copper wiring having this type of structure, a mass transfer occurs via grain boundaries of the copper grains. As a result, EM can occur.

In wiring having a small width, the size of copper grains becomes small. Consequently, EM problems from mass transfer through such grain boundaries can be very pronounced. Several investigations have been undertaken that mix silver with copper in wirings to try to resolve the EM problem.

Wirings made from copper alloys containing silver, niobium, or aluminum oxide ($Al_2O_3$) are disclosed in Japanese Patent Application Publication 11-204524A. For such approaches, it is preferable that the amount of silver within the wiring be equal to or less than 1% by mass, and that the amount of niobium is equal to or less than 0.4% by mass, for example. If the amount of silver or niobium is made equal to or higher than the amounts set forth above, an alloy phase can precipitate locally within the wiring that has silver or niobium as its main constituent. Such a phase can result in undesirable differences in the electrical conductivity of the wiring.

Wirings made of copper alloys containing silver (Ag), arsenic (As), bismuth (Bi), phosphorous (P), antimony (Sb), silicon (Si), or titanium (Ti) are reported in Japanese Patent Publication JP 2000-349085A. In the publication, the amount of Ag, As, Bi, P, Sb, Si, or Ti within a wiring is equal to or greater than 0.1% by mass, and less than the maximum solid solubility limit for the element. It is considered that if an amount of silver added to copper is equal to or greater than the maximum solid solubility limit, a portion of the silver does not alloy, but precipitates out. Thus, a resulting conductivity can be lowered.

Recently, the development of stress migration in copper wirings has become a problem. FIGS. 11(*a*) and 11(*b*) are cross sectional views of multi-layer copper wirings formed by a damascene method. In such a structure, an upper layer wiring 121*b* is connected to an upper portion of a lower layer wiring 121*a*. An upper layer wiring 121*b* includes a connection plug and a wiring formed on an upper portion thereof.

Due to stress migration of copper in this type of multilayer copper wiring, a void 122*a* (shown in FIG. 11(*a*)) or a void 122*b* (shown in FIG. 11(*b*)) may develop at an interface between a lower layer wiring 121*a* and an upper layer wiring 121*b*. Such voids can cause connection failures between wirings, lowering yields of the semiconductor device. Further, such semiconductor devices can become unstable over long-term use.

Void 122*a* can develop in the upper layer wiring 121*b* side as shown in FIG. 11(*a*). That is, the void 122*a* develops in a portion of the connection plug constituting the upper layer wiring 121*b*. It is thought that this type of void 122*a* develops due to the occurrence of copper "shrinkage" within the upper layer wiring 121*b*, resulting in copper migrating upward within connection plug. This type of void 122*a* develops very conspicuously in high-temperature heat treatment cycles.

On the other hand, void 122*b* develops in an upper surface of lower layer wiring 121*a* in FIG. 11(*b*). This type of void 122*b* is thought to be developed by the accumulation of defects due to copper diffusion at surfaces of the lower layer wiring 121*a* contacting the connection plug portion of the upper layer wiring 121*b*.

In accordance with an investigation by the inventors of the present invention, it has been discovered that the type of cavitation (e.g., void) phenomena noted above occurs conspicuously around the temperature of approximately 150° C. Unfortunately, this is a temperature that a semiconductor device commonly experiences (for example during a bonding process, photoresist baking process, or the like).

The development of such above-mentioned voids 122*a* and 122*b* can be the cause of connection failures that develop between a connection plug and wiring. This can result in reductions in yield of such semiconductor devices, or long term instability in the operation of such semiconductor devices.

As noted above, voids 122*a* and 122*b* are believed to be caused by internal stress that develops within copper wiring due to thermal cycles imparted by semiconductor processing and the like. Thus, in addition to improving yields and reducing instability in a semiconductor device, the prevention of voids can have other stress reduction related advantages. In particular, the prevention of voids like 122*a* can be effective in suppressing deformation of an overall wiring. Further, the prevention of voids like 122*b* can increase the material strength of the surface of the wiring.

From the above it is understood that materials utilized in forming metallic regions such as wirings, along with processing steps, must be considered in order to suppress the development of these types of stress migration and corresponding deleterious effects.

In addition, in recent years there has been a demand for higher level characteristics in the operation of elements of a semiconductor device. As a result there is a need for the development of materials, such as those used for wirings that show high-speed operation characteristics that can exceed those of conventional copper wirings.

In light of the above, it would be desirable to arrive at semiconductor device having a metallic region that has increased resistance to stress migration, and/or increased reliability as compared to the above mentioned conventional approaches. In addition, it would be desirable to provide a process that can manufacture such a semiconductor device in a stable fashion.

SUMMARY OF THE INVENTION

The present invention may include a semiconductor device having a semiconductor substrate and a metallic region formed on the semiconductor substrate having copper as a main constituent. The metallic region can include a different element portion formed in the vicinity of an upper portion of the metallic region. The different element portion can include at least one other metallic element, that is not copper, in an amount different than the other portions of the metallic region.

In such an arrangement, copper and the other metallic element can be alloyed in the different element portion, thus increasing the strength of the metallic region at that location. A surface of the metallic region can thus be protected, and stress migration of the metallic region reduced. Possible examples of at least one of the different metallic elements include beryllium (Be), magnesium (Mg), zinc (Zn), palladium (Pd), silver (Ag), cadmium (Cd), gold (Au), mercury (Hg), platinum (Pt), silicon (Si), zirconium (Zr), aluminum (Al), titanium (Ti), and the like. Such other metallic elements can be included alone within the different element portion, or two or more such different elements can be included in the different element portion.

It is noted that a rate of increase of resistance in the metallic region can be suppressed if Be, Mg, Zn, Pd, Ag, Cd, Au or Hg are used as the at least one other metallic element. Further, adhesion between the metallic region and an insulating film can be increased for cases in which Zr, Al or Ti are included as one of the other metallic elements.

The metallic region can be formed so that one or more other metallic element can be diffused from an upper portion surface side, and the content ratio amount of the other type metallic element can decrease in the direction toward a bottom of the metallic region. This can increase the strength of the upper portion surface side, and the rate of increase in resistance of the overall metallic region can be lowered, as compare to some uniformly diffused cases. Further, the at least one other type metallic element has a tendency to be unevenly distributed in the surface of the metallic region, thus forming a different element portion in the vicinity of an upper portion of the metallic region.

According to one aspect of the embodiments, at least one of the different type of metallic elements can be more electrochemically noble than copper.

Some examples of metallic elements that are more electrochemically noble than copper include Ag, Au, Hg, platinum (Pt), and Pd. By using an element that is more electrochemically noble than copper, at least one of the different type of metallic elements can be made to precipitate out evenly into the surface of a metallic region according to a displacement plating method. This is one particular way in which a different element portion can be formed that can protect a metallic region, and undesirable increases in metallic region resistance can be suppressed.

According to one particular aspect of the embodiments, at least one of the different metallic elements can be silver.

According to another aspect of the embodiments, a connection plug can be formed in contact with an upper surface of the different element portion. In such an arrangement, an interface with the connection plug can be protected by the different element portion, and resistance to stress migration in the metallic region can be increased.

According to another aspect of the embodiments, the amount of at least one of the different metallic elements, with respect to all metals constituting the different element portion, can exceed the solid solubility limits of at least one of the different metallic elements in copper. In such a resulting structure, the different element portion can be effectively strengthened, and resistance to stress migration can be increased.

The present invention can also include a semiconductor device having a semiconductor substrate, a first metallic region formed on the semiconductor substrate, and a second metallic region that covers at least a portion of an upper surface of the first metallic region. The second metallic region can be formed from a metal selected from a group that includes a metal having a higher recrystallization temperature than the metal constituting the first metallic region, and a metal having a narrower hysteresis width than the metal constituting the first metallic region.

Hysteresis width can be reduced by increasing the recrystallization temperature of the metallic region. The recrystallization temperature is the temperature at which grain deformation and grain growth develop due to diffusion of atoms. As shown in FIG. 14, the recrystallization temperature is a point of inflection in the temperature-internal stress curve in the heating process. That is (in FIG. 14), an intersection of the sloped line and the essentially horizontal line that follow the heating temperature curve. More particularly, if the recrystallization temperature $T_1$ is increased, the slope of the sloped line can be made more gentle, and the portion of the curve corresponding to the horizontal line (e.g., horizontal plateau) can be reduced. Thus, the temperature-internal stress curve can become smaller, as shown by comparing FIGS. 13(*a*) and 13(*b*), and the hysteresis width can become smaller. That is, by making the difference between the maximum value of the process temperature (i.e., right end point of the hysteresis curve in FIGS. 12, 13(*a*), 13(*b*)) and the recrystallization temperature $T_1$ smaller, there can be fewer irreversible losses in the metallic region when exposed to a thermal history. In this way, stress migration can be effectively suppressed.

Further, a high recrystallization temperature can become an important feature in attaining a metallic region having a high degree of reliability, as voids can develop in the metallic region, and deformation can occur if recrystallization takes place.

In accordance with a structure like that of the above arrangement, a portion of an upper surface of a first metallic region can be covered by a second metallic region. This can protect the first metallic region.

A first metallic region can be formed by a method such as plating, chemical vapor deposition (CVD), or sputtering. Even if boundaries exist in the upper surface of the first metallic region, the surface can be protected, and therefore stress migration can be suppressed. Further, with a portion of the upper surface of the first metallic region covered by the second metallic region, which can be highly resistant to stress migration, displacement of metal constituting the first metallic region can be suppressed by the second metallic region. This can reduce the stress migration of the first metallic region.

In one particular arrangement, hysteresis can be effectively reduced by making the recrystallization temperature of the metal forming the second metallic region higher than 200° C., preferably equal to or higher than 300° C. In such an arrangement, the development of stress migration can be stably reduced. Further, the process temperature of a semiconductor device is normally equal to or less than 400° C. Therefore, stress migration during processing can be more effectively suppressed if the recrystallization temperature is set equal to or higher than 350° C.

According to another aspect of the embodiments, a first metallic region can include a main constituent metallic element, and a second metallic region can be an alloy that differs from the first metallic region and includes the main constituent metallic element and a different metallic element.

In one very particular approach, the first metallic region can contain copper as a main constituent metallic element. The different metallic element can be selected from the group consisting of Be, Mg, Zn, Pd, Ag, Cd, Au, Pt, Si, Zr, Al and Ti. Further, the second metallic region can be an alloy of one or more of the above elements and copper. In such an arrangement, the recrystallization temperature of the metals constituting the second metallic region can be increased.

A hysteresis width of a metal constituting a second metallic region can be preferably set to equal to or less than 150 megaPascals (MPa), and preferably equal to or less than 100 MPa. In such an arrangement, stress migration can be stably suppressed. In addition, the development of stress migration can be effectively suppressed for cases of a very fine wiring on the order of 0.1 microns, provided a hysteresis width is set to 80 MPa.

Still further, the elastic limit of the metal constituting the second metallic region can be preferably higher than the elastic limit of the metal constituting the first metallic region. In such an arrangement, the first metallic region can be effectively protected by the second metallic region.

According to one aspect of the embodiments, a connection plug can be electrically connected to the first metallic region through the second metallic region. Such an arrangement can protect an interface between the connection plug and the first metallic region. This can increase resistance to stress migration.

According to another aspect of the embodiments, a second metallic region can contain a metal that is more electrochemically noble than the metal constituting the first metallic region. That is, a second metallic region can contain a metal having a lower tendency to ionize than a metal constituting the first metallic region. By using such a more electrochemically noble metal, such a metal can be made to precipitate out more uniformly on the surface of the first metallic region in a displacement plating method. Resistance to stress migration can thus be increased.

According to another aspect of the embodiments, a first metallic region can include a main constituent metal. A second metallic region can contain a different metallic element diffused therein that is different than the main constituent metal. Such an arrangement can result in a second metallic region being an alloy of the main constituent metal of the first metallic region and the different metallic element.

According to another aspect of the embodiments, a first metallic region can further include a different metallic element in a first amount ratio with respect to the other elements of the first metallic region. A second metallic region can include the different metallic element in a second amount ratio with respect to the other elements of the second metallic region. The first amount ratio can be less than the second amount ratio with respect to the different metallic element.

In one particular approach, a second metallic region can be formed so as to produce almost no increase in the resistance of any resulting structure. For example, a region in which the amount of the different metallic element, with respect to all other metals, is equal to or less than 0.1% by mass can be the first metallic region. A region in which amount of the different metallic element, with respect to all other metals, is greater than 0.1% by mass can be the second metallic region. A limit to any increase in resistance can be thus ensured by the first metallic region, while stress migration can be reduced by the second metallic region.

According to another aspect of the embodiments, a ratio amount of the different metallic element in the second metallic region, with respect to the other metals of the second metallic region, can exceed the solid solubility limits of the different metallic element in the main constituent metallic element. With a structure according to the above, a second metallic region can be effectively increased in strength, and resistance to stress migration can be increased.

According to another aspect of the embodiments, the different metallic element is silver.

According to another aspect of the embodiments, the main constituent metallic element is copper.

The present invention can also include a semiconductor device having a semiconductor substrate, a first metallic region formed on the semiconductor substrate that includes a metal containing copper, and a second metallic region that covers at least a portion of an upper surface of the first metallic region. The second metallic region can be formed from a metal different from that of the first metallic region, and can be an alloy of copper and silver.

The inventors of the present invention have discovered that if a metallic region in a semiconductor device is formed of a copper alloy containing silver, irreversible losses when undergoing a thermal history in a semiconductor manufacturing process, and the like, can be less than that of structures formed only of copper, and stress migration can be effectively suppressed. Further, the inventors have also discovered that having a high content ratio of silver with respect to the overall copper alloy can effectively inhibit stress migration.

In addition, by forming a first metallic region using copper as a main constituent metal, and providing protection with a second metallic region formed as a silver containing copper alloy in an upper portion thereof, stress migration of the first metallic region and the second metallic region can be suppressed. Further, if the content of silver is increased, with respect to all other metals constituting the second metallic region, stress migration can very effectively be suppressed.

As one very particular example, a region in which the amount of silver with respect to all other metals is equal to or less than 0.1% by mass can be a first metallic region. A region in which the amount of silver with respect to all other metals is greater than 0.1% by mass can be made into a second metallic region. In such an arrangement, there can be essentially no increase in resistance, even if silver is added to copper, provided the content of silver with respect to all other metals is equal to or less than 0.1% by mass. Therefore, limits to any increase in resistance can be ensured by the first metallic region, while stress migration can be reduced by the second metallic region.

According to one aspect of the embodiments, the first metallic region can be formed from a metal containing an alloy of copper and silver, and the amount of silver can be a first ratio with respect to the other elements of the first metallic region. The amount of silver in the second metallic region with respect to all other elements of the first metallic region can be a second ratio. The first ratio can be less than the second ratio with respect to the amount of silver. In such an arrangement, the first metallic region can be protected by the second metallic region, and stress migration can be effectively suppressed in a resulting structure.

According to another aspect of the embodiments, a connection plug can be electrically connected to the first metallic region through the second metallic region.

According to another aspect of the embodiments, a first metallic region and second metallic region together form a structure selected from the group consisting of a wiring, a plug, and a pad.

It is noted that according to the present invention, a first metallic region and/or second metallic region can contain other materials. As but particular examples, Zr, indium (In), Al, Ti and tin (Sn) can be added to metals in amounts equal to or less than 1% by mass. By including such metals, adhesion can be increased between the metallic regions and other films, such as an insulating film, barrier metal film, and the like.

The present invention also includes a method of manufacturing a semiconductor device. The method can include forming a metallic film on a semiconductor substrate that includes a main constituent metallic element, and depositing a metallic element that is different from the main constituent metallic element to cover at least a portion of the upper surface of the metallic film. The method can also include diffusing the different metallic element into an upper portion of the metallic film.

According to one aspect of the embodiments, the step of depositing the different metallic element can include bringing a solution, which contains the different metallic element, into contact with the metallic film. In addition, the different metallic element can be more electrochemically noble than the main constituent metallic element.

According to another aspect of the embodiments, the step of diffusing the different metallic element into the upper portion of the metallic film can include heat treating the metallic film. Such heat treating can increase the particle grain diameters of the metallic film, thus reducing a resulting resistance value. Further, the different metallic element can be more uniformly dispersed within the metal of the metallic film at an interface between the main constituent metallic element and the different metallic element, and precipitation strengthening can occur.

According to another aspect of the embodiments, the step of depositing the different metallic element can include depositing by a displacement plating method. A displacement plating method can result in a film thickness remaining as is, while an upper portion of the metallic film can be displaced with the different metallic element. As a result, a film can be formed according to an original thickness, and a surface flatness can be maintained.

According to another aspect of the embodiments, a main constituent metallic element can be copper, and a different metallic element can be silver.

While the present invention has been described according to particular embodiment features above, such features can be applied to various particular structures. For example, the present invention can have a pronounced advantageous effect when applied to wiring structures manufactured according to a Damascene method. Even more particularly, first and second metallic regions according to the present invention can be formed by a single Damascene method or a dual Damascene method.

Particular approaches to forming such structures are described below. A single Damascene method can include the following steps:

(a) forming a first wiring from a first metallic film on a semiconductor substrate;

(b) forming a second metallic film on a surface of the first wiring;

(c) forming a first interlayer insulating film on the entirety of an upper portion of the semiconductor substrate to cover the first wiring;

(d) selectively removing the first interlayer insulating film to form a connection hole that reaches an upper surface of the first wiring;

(e) covering an inner surface of the connection hole with a barrier metal film and forming a metallic film that is embedded in the connection hole;

(f) removing the metallic film outside the connection hole to form a plug;

(g) forming a second interlayer insulating film on the entirety of an upper portion of the semiconductor substrate to cover the plug;

(h) forming a wiring groove that exposes the plug in a bottom surface by selectively removing the second interlayer insulating film;

(i) forming a barrier metal film that covers an inner surface of the wiring groove, and forming a first metallic film that is embedded in the wiring groove;

(j) forming a second wiring by removing portions of the first metallic film formed outside the groove; and (k) forming a second metallic film on the surface of the second wiring.

A semiconductor device according the present invention, and method of manufacturing the same, can be applied to the process set forth above. All or a portion of the first metallic films and connection plug can correspond to a “first metallic region” of the present invention. Any of the second metallic films can correspond to a “second metallic region” of the present invention. Of course, depending upon the particular process employed, one or more of steps (a) to (k) can be omitted.

A dual Damascene method can include the following steps:

(a) forming a first wiring from a first metallic film on a semiconductor substrate;

(b) forming a second metallic film on a surface of the first wiring;

(c) forming a first interlayer insulating film on the entirety of an upper portion of the semiconductor substrate to cover the first wiring;

(d) selectively removing the first interlayer insulating film to form a connection hole that reaches an upper surface of the first wiring, and to form a wiring groove connected to the connection hole;

(e) covering an inner surface of the connection hole and wiring groove with a barrier metal film and forming a metallic film from the first metallic film that is embedded in the connection hole and wiring groove;

(f) forming a second wiring by removing portions of the metallic film formed outside the wiring groove; and (g) forming a metallic film from the second metallic film on the surface of the second wiring.

A semiconductor device according the present invention, and method of manufacturing the same, can be applied to the process set forth above. All or a portion of the first metallic films can correspond to a “first metallic region” of the present invention. Any of the second metallic films can correspond to a “second metallic region” of the present invention. Of course, depending upon the particular process employed, one or more of steps (a) to (g) can be omitted.

A wiring structure formed by a Damascene process, as described above can have a structure that includes:

a semiconductor substrate;

a first wiring formed on the semiconductor substrate;

a first metallic protective film formed on a surface of the first wiring;

a connection plug connected to the first wiring;

a second wiring connected to the connection plug; and a second metallic protective film formed on a surface of the second wiring.

The present invention can be applied to the structure set forth above. All or a portion of the first wiring or connection plug can correspond to a "first metallic region" of the present invention. Any of the metallic protective films can correspond to a "second metallic region" or "different element portion" of the present invention.

DETAILED DESCRIPTION OF THE EMBODIMENTS

Prior to describing various particular embodiments of the present invention, stress responses of metallic regions, and well as various findings by the inventors of the present invention will be discussed.

Figure 12:
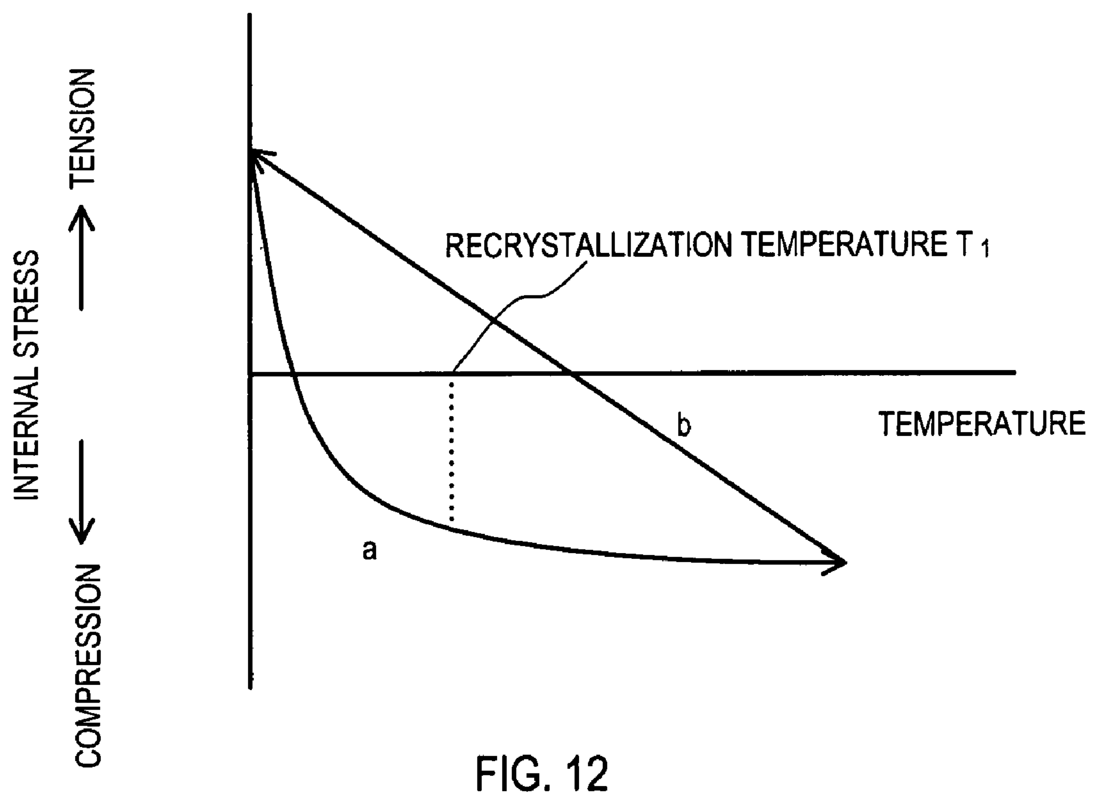
FIG. 12 is a graph showing an example of a relationship between temperature and internal stress of a metallic region.
Figure 13:
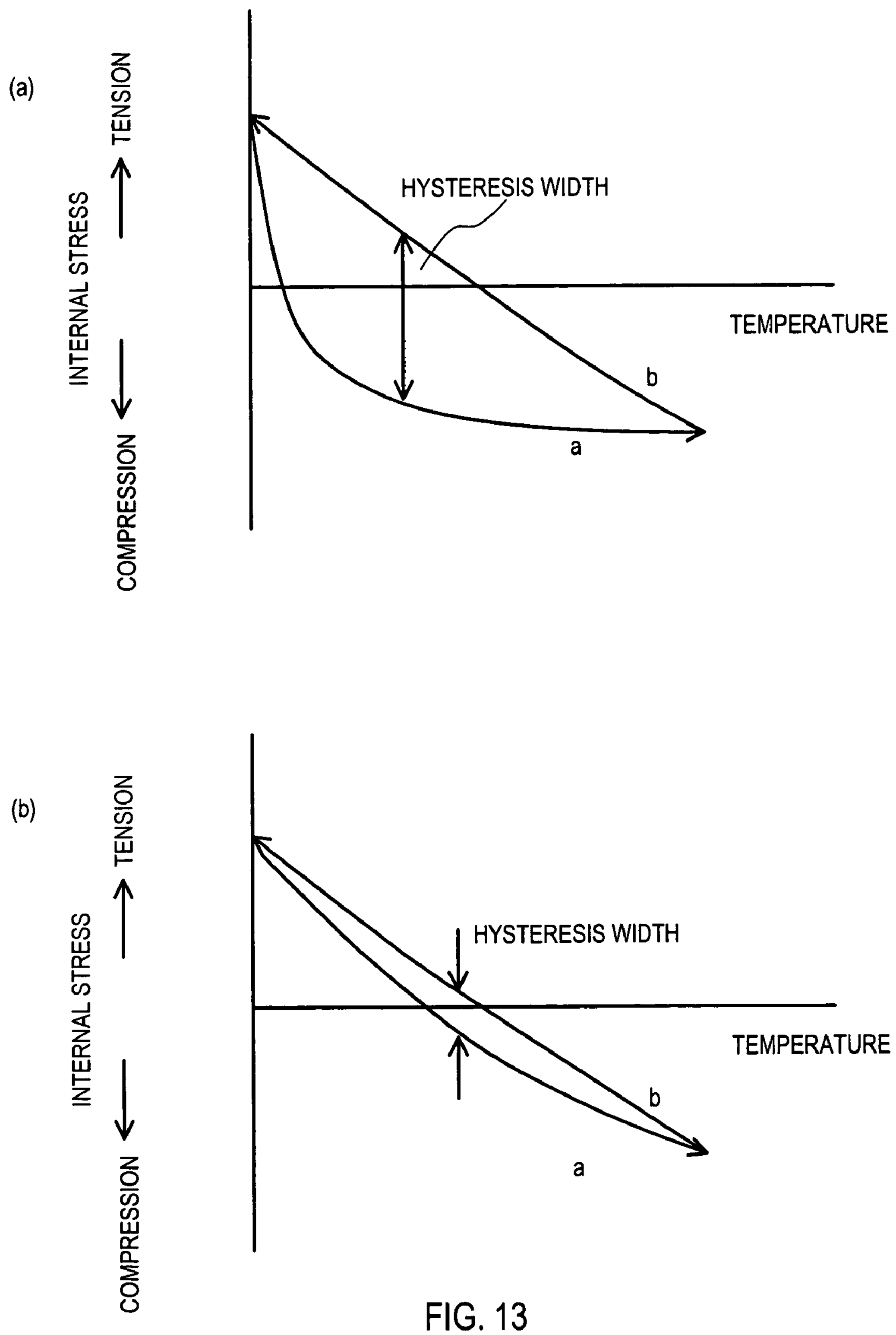
FIGS. 13(*a*) and 13(*b*) are graphs showing examples of relationship between temperature and internal stress of a metallic region.
Figure 14:
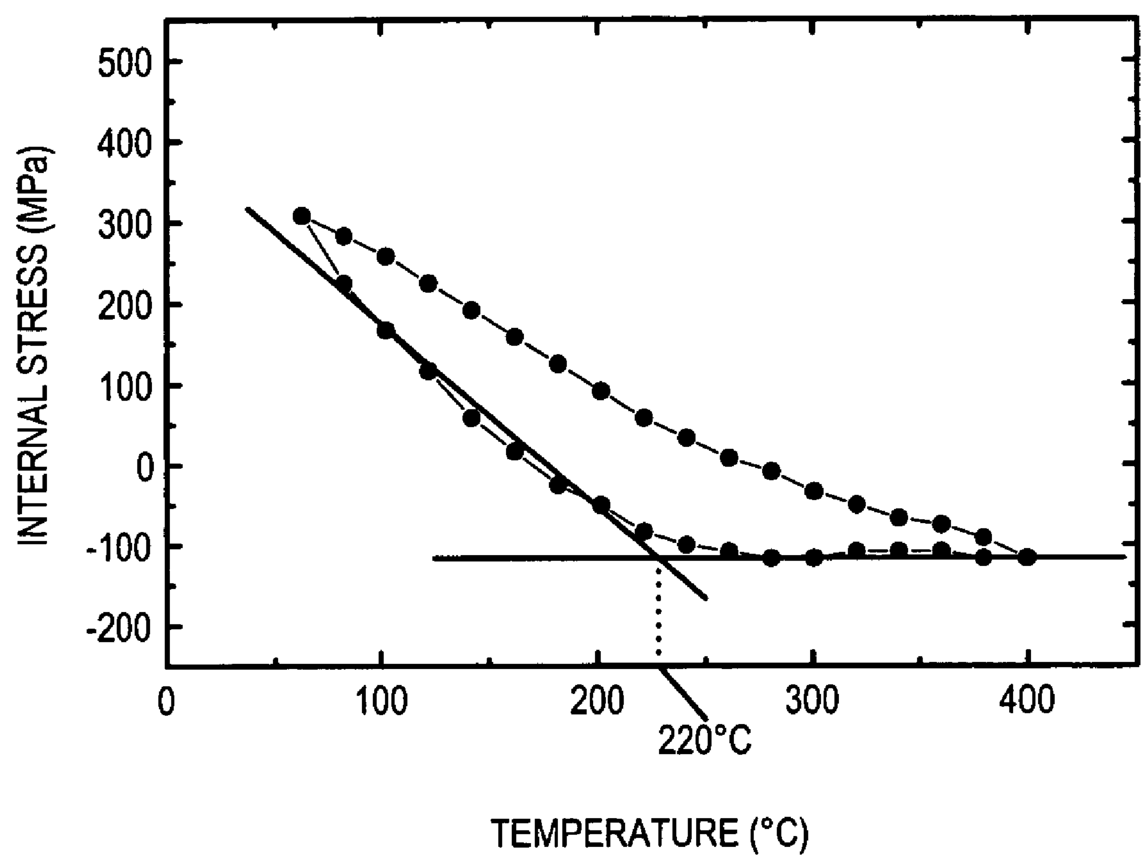
FIG. 14 is a diagram showing recrystallization temperature and the relationship between temperature and internal stress.

FIG. 12 and FIG. 13 are diagrams showing changes in the internal stress of a metallic region for a semiconductor device. The changes are induced by heating and cooling processes. The horizontal axis of the figures shows temperature, while the vertical axis shows stress. The internal stress within the metallic region changes from a tensile mode to a compressive mode along with an increase in temperature with respect to room temperature.

If a recrystallization temperature $T_1$ of the metal forming the metallic region is exceeded, plastic deformation can develop as shown in FIG. 12, and internal stress can transition while displaying a relatively constant value (process a). Subsequently, the internal stress within the metallic region changes from the compressive mode to the tensile mode at a relatively constant rate along with a lowering of the temperature (process b).

The relationship between temperature and internal stress of the metallic region generally differs between the heating process and the cooling process when a thermal history is thus applied to a semiconductor device.

The inventors of the present invention have surmised that irreversible losses of the metallic region can become large due to such differences resulting from stress migrations within the metallic region. An index for expressing this difference is defined as a "hysteresis width". A hysteresis width defines a maximum width of divergence between a curve representing a heating process and a curve representing a cooling process. For example, if reference is made to FIG. 13, a maximum width between process "a" and process "b" can be a hysteresis width for the material illustrated. The larger a hysteresis width (that is, the larger the difference between the heating process and the cooling process), the larger the stress migration and amount of deformation in a metallic region. Such stress migration/deformation can result in wire breakage, and the like, due to development of voids. This, in turn, can reduce device, reliability.

Figure 11:
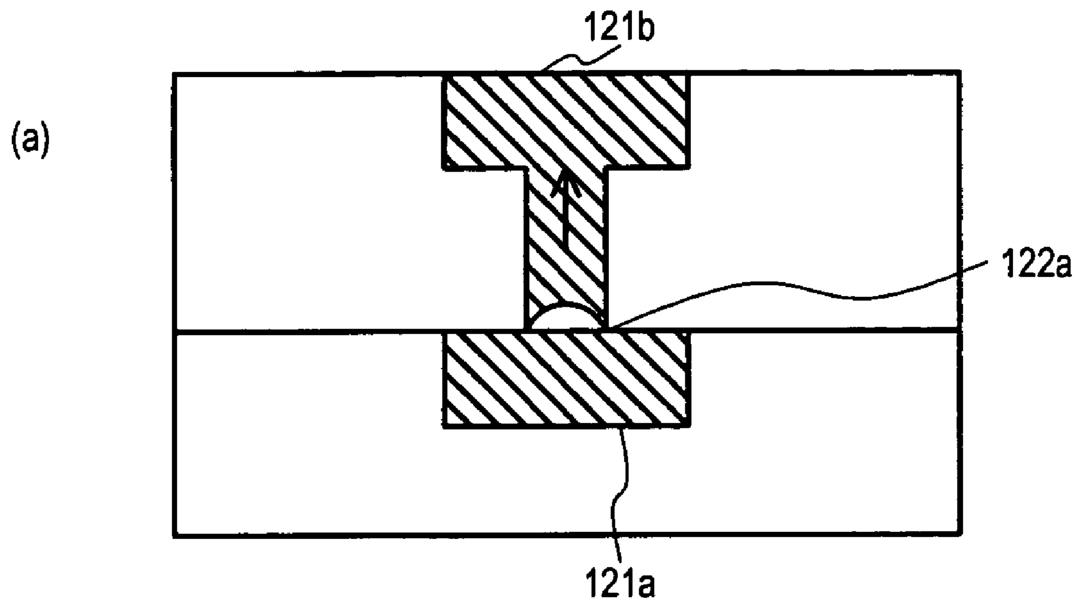
FIGS. 11(*a*) and 11(*b*) are cross sectional diagrams showing wiring structures in which a void can develop due to stress migration.
Figure 11:
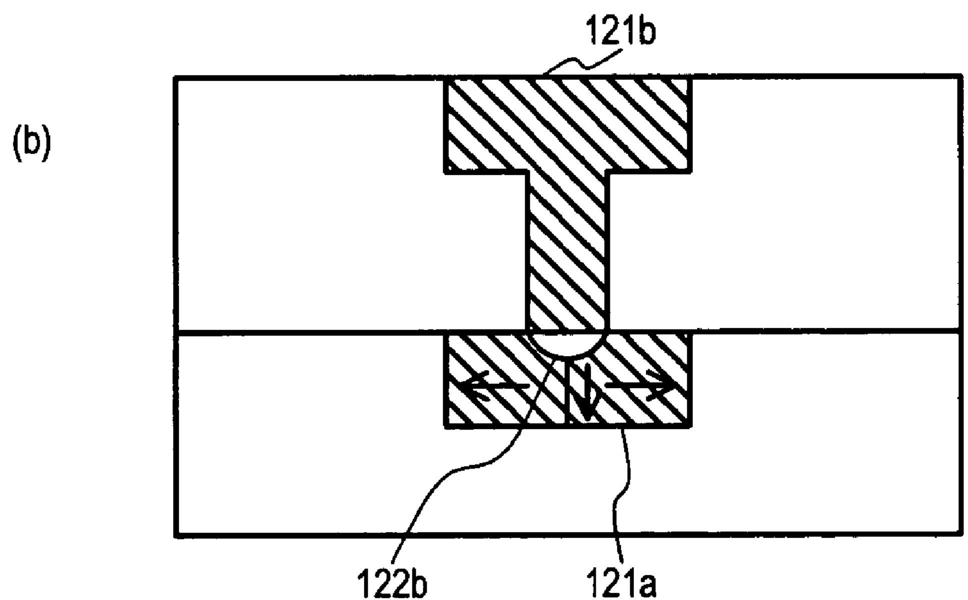

Further, in accordance with investigations by the inventors of the present invention, a void of the type shown in FIG. 11(*b*) has been determined to develop in the vicinity of grains on the surface of the wiring. In particular, voids can easily develop in portions at which a number of grain boundaries overlap. From this result, the inventors of the present invention have discovered that stress migration can easily develop in the boundary portions of the surface of a wiring. In particular, the development of stress migration in the wiring and connection plug can be one cause of cavitation for those cases in which such boundaries exist in the vicinity of the interface between the wiring and the connection plug.

Based on the above inferences, the inventors of the present invention have attained the present invention as one way to control stress migration at the interfaces of the metallic region.

The present invention will hereinafter be described in more detail on the basis of various particular embodiments and with reference to accompanying drawings.

Figure 1:
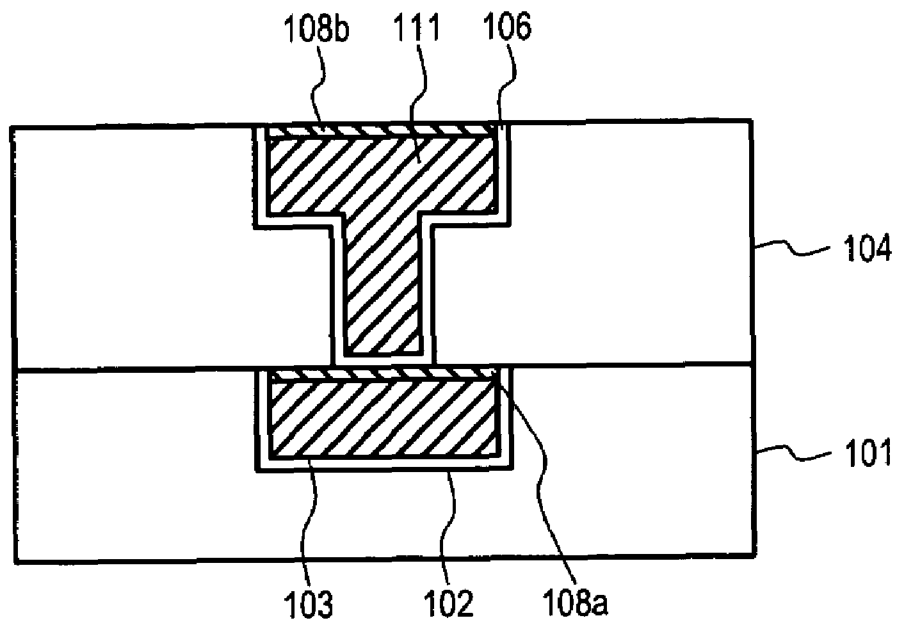
FIGS. 1(*a*) and 1(*b*) are cross sectional views showing examples of semiconductor device structures according to the present invention.
Figure 1:
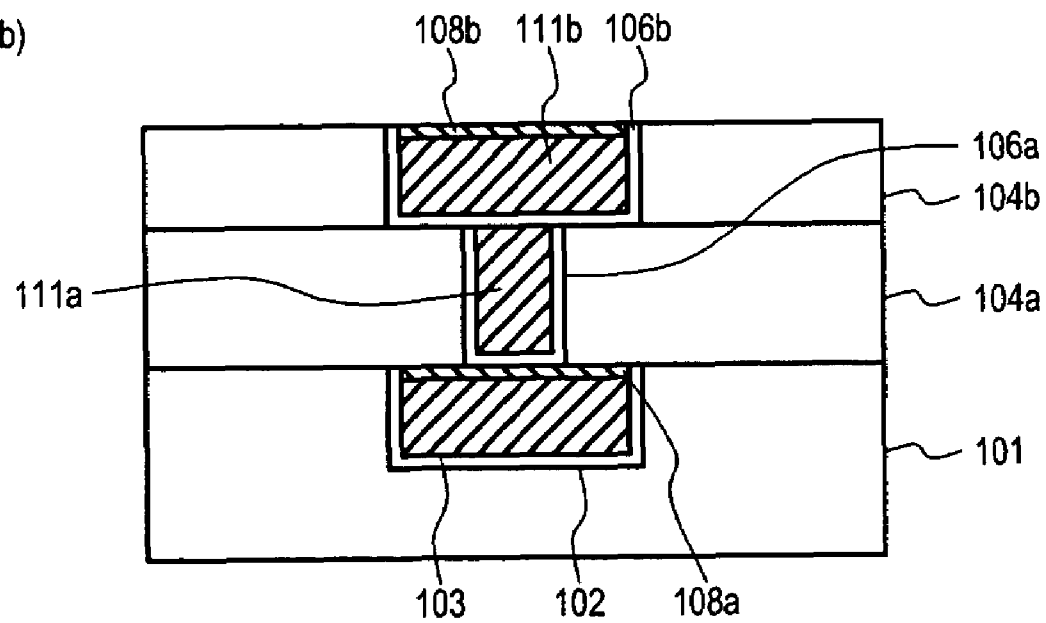

FIGS. 1(*a*) and 1(*b*) are a cross sectional diagram showing one example of a semiconductor device according to the present invention. FIG. 1(*a*) is an example of the present invention as utilized in copper multi-layer wiring formed by so called "dual Damascene" method. A lower layer wiring can be made from a barrier film 102 and a copper containing metallic film 103. A lower layer wiring can be formed within an insulating film 101. A silver containing protective metallic film 108*a* can be formed on a surface of the copper containing metallic film 103.

Referring still to FIG. 1(*a*), an interlayer insulating film 104 can be formed over the lower layer wiring. An upper layer wiring can be formed within the interlayer insulating film 104. An upper layer wiring can be made from a barrier metal film 106 and a copper containing metallic film 111. A silver containing metallic film 108*b* is also formed on a surface of a copper containing metallic film 111. An upper layer wiring has a "T" shape when viewed in cross section, and a lower portion of the T can constitute a wiring plug, while an upper portion of the T can constitute an upper layer wiring.

Copper containing metallic films 103 and 111 can be formed of a metal in which the amount of copper is equal to or greater than 50% by mass. Further, copper containing metallic films 103 and 111 can also contain gold or platinum in addition to silver, as will be described in more detail below. Copper containing metallic films 103 and 111 can also contain chrome, molybdenum, and the like.

It is noted that in this specification, the term "alloy" means two or more types of metallic elements that are fused or solidified. Further, substances that contain non-metals or half-metallic elements in addition to metallic elements are referred to as alloys. Still further, while the term alloy is intended to encompass cases in which solid solutions or intermetallic compounds exist as compound elements in an organizational state, such a term is also intended to include other cases in which such elements are mixed. That is, substances in which components exceed a solid solubility limit are also referred to as alloys in this specification.

Silver containing protective metallic films 108*a* and 108*b* can be formed from only silver, or can be formed from an alloy containing silver. In the present embodiment, there is no particular lower limit to the content of silver for silver containing protective metallic films 108*a* and 108*b* in the form of an alloy. The amount of silver can be greater than 0.1% by mass, for example. The silver content is preferably equal to or greater than 1% by mass, and more preferably, equal to or greater than 2% by mass. Such an arrangement can suppress the development of stress migration.

Further, the amount of silver in silver containing protective metallic films 108*a* and 108*b* can be in a range that exceeds the solubility limit of silver with respect to copper. Such an allowable range can enable stress migration to be more effectively suppressed, even if there are variations in manufacturing process, or the like. The reason for such a result is not completely clear, but it is noted that when silver containing protective metallic films 108*a* and 108*b* are exposed to a thermal history, the hysteresis influence is dramatically reduced.

Figure 15:
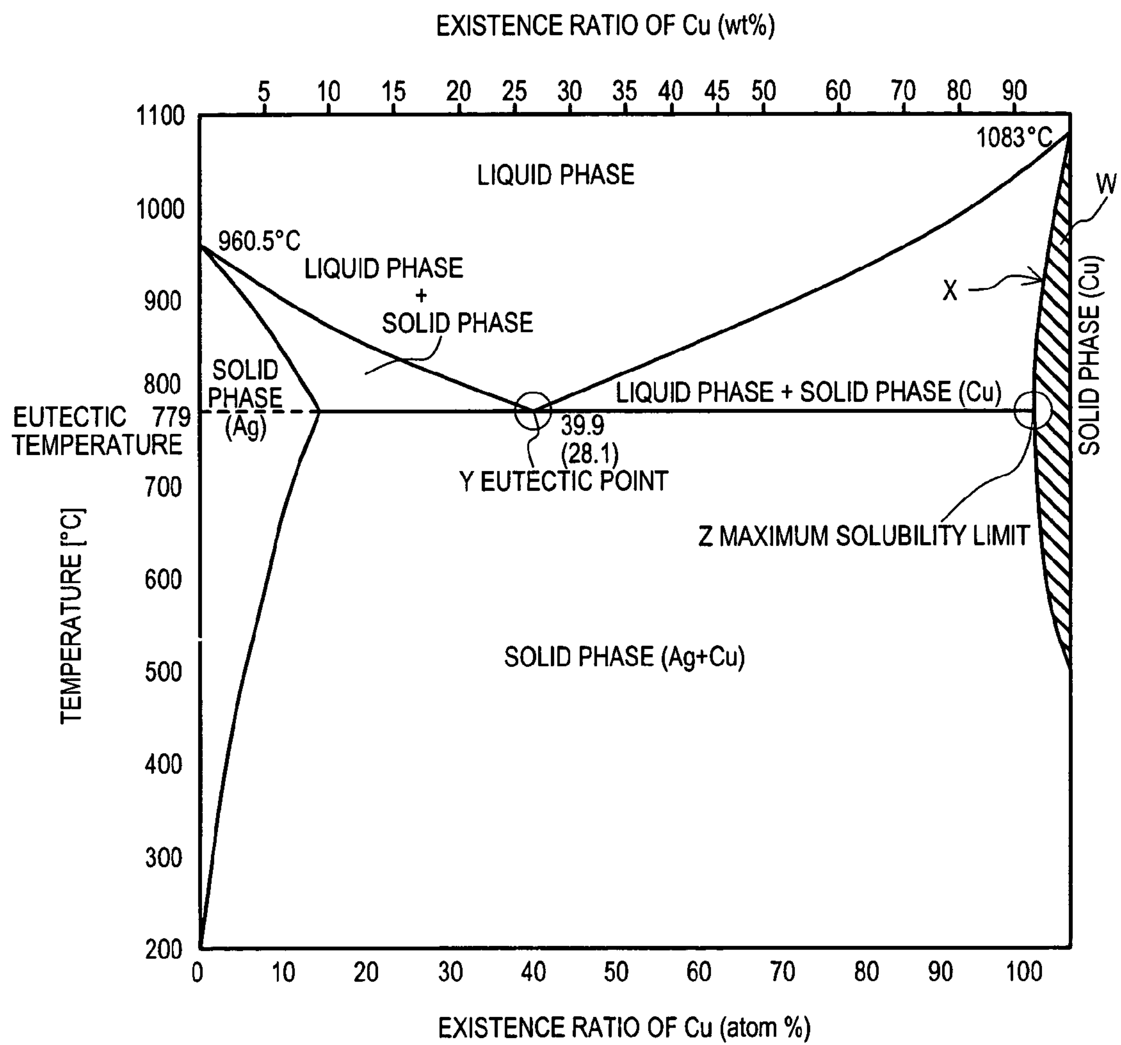
FIG. 15 is eutectic phase diagram of a two-component Ag—Cu compound.

The solid solubility limit of silver (Ag) with respect to copper (Cu) will be described with reference to FIG. 15. As shown in FIG. 15, a two-component eutectic system for a compound of Ag—Cu has a eutectic point Y of 39.9 atom % (a conversion of mass % of silver with respect to copper). FIG. 15 also shows a eutectic temperature of 779° C. and a maximum solubility limit Z of Ag with respect to Cu (the point where the solid solubility limit of Ag is a maximum). Such a maximum solubility limit of Ag is 4.9 atom % (a conversion of mass % of silver with respect to copper). In FIG. 15, a curve X shows a solid solubility limit of silver. At the temperature 779° C., such curve reaches a maximum Z.

A maximum processing temperature in the manufacture of a semiconductor device can be on the order of approximately 400° C. The solid solubility limit of Ag with respect to Cu at this limit is on the order of 1 atom % (a conversion of mass % of silver with respect to copper). In the relationship between atom % standard and weight % standard of a copper-alloy, a silver amount of 0.9 atom % correspond to 1.5 mass %.

According to the present embodiment, there can be no particular limit for the average content of silver with respect to all of the metals constituting silver containing protective metallic films 108*a* and 108*b*. But from a vantage point of stably forming such films, it is preferable that such an upper limit be equal to or less than 99% by mass, more preferably equal to or less than 80% by mass, even more preferably equal to or less than 50% by mass.

Copper containing metallic films 103 and 111 and silver containing protective metallic films 108*a* and 108*b* can be formed of alloys of copper and silver. In one particular approach, the content of silver with respect to all of the metals constituting protective metallic films 108*a* and 108*b* can be higher than the content of silver with respect to all of the metals constituting copper containing metallic films 103 and 111.

As discussed later by comparative example 1 and comparative example 2 below, the recrystallization temperature of a copper wiring can become higher by increasing the content of silver with respect to all of the metals included in the copper wiring. This can increase resistance to stress migration.

It is also noted that an advantage to an arrangement like that of FIGS. 1(*a*) and 1(*b*) can be that upper portions of copper containing metallic films 103 and 111 can be protected by silver containing protective metallic films 108*a* and 108*b*.

Additionally, it is noted that essentially no increase in resistance can develop when silver is added to copper, provided the content of silver with respect to all of the other metals is equal to or less than 0.1% by mass. Thus, inclusion of silver into a copper wiring in these amounts can ensure that a rate at which wiring resistance increases is reduced.

Referring still to FIGS. 1(*a*) and 1(*b*), a region in which the amount of silver with respect to all metals of the region is equal to or less than 0.1% by mass, can be copper containing metallic films 103 and 111. Further, a region in which the amount of silver with respect to all metals is greater than 0.1% by mass, can be silver containing protective metallic films 108*a* and 108*b*.

Preferably, a lower limit of the average film thickness for silver containing protective metallic films 108*a* and 108*b* can be equal to or greater than 5 nanometers (nm). In such an arrangement, stress migration to the copper containing metallic films 103 and 111 can be reduced. Further, while no particular upper limits to a thickness of silver containing protective metallic film 108*a* is intended, such a thickness can be equal to or less than 60% of the total average film thickness of copper containing metallic film 103 and silver containing protective metallic film 108*a*, and more preferably such a thickness can be equal to or less than 20% of such a total average thickness. Similarly, while no particular upper limits to a thickness of silver containing protective metallic film 108*b* is intended, such a thickness can be equal to or less than 60% of the total average film thickness of the upper portion of the "T" of copper containing film 111 and silver containing protective metallic film 108*b*, and more preferably such a thickness can be equal to or less than 20% of such a total average thickness.

From the vantage point of increasing resistance to stress migration, it is preferable that the content of silver with respect to all metals of a wiring be high. However, from the vantage point of reducing wiring resistance, it is preferable that the content of silver with respect to all metals of a wiring be low.

Stress migration to the copper containing metallic films 103 and 111 can be reduced in this embodiment by protecting the wiring surface, which can be influenced by stress migration, using silver containing metallic protective films 108*a* and 108*b*. Further, a high performance semiconductor device having a good yield can be manufactured without unwanted increase in a contact resistance of a connection plug. Still further, while high concentrations of silver diffused into metals can give rise to increases in residual stress, and hence degradation in yield, such problems can be reduced in accordance with structures like that of the embodiments shown.

FIG. 1(*b*) is an example of applying the present invention to a multi-layer copper wiring structure formed by a single Damascene method. With a structure like FIG. 11(*b*), further suppression of stress migration can be obtained because a copper containing metallic film is separated into two portions, a connection plug portion 111*a* and a wiring portion 111*b*, by situating a barrier metal film 106*b* in between the two.

A lower layer wiring made from a barrier layer film 102 and a copper containing metallic film 103 can be formed within insulating film 101 of FIG. 1(*b*). A first interlayer insulating film 104*a* and a second interlayer insulating film 104*b* can be formed on the top thereof. A via (or plug) made from a copper containing metallic film 111*a* and a barrier film 106*a* can be formed within first interlayer insulating film 104*a*. An upper layer wiring made from barrier metal film 106*b*, copper containing metallic film 111*b*, and silver containing metallic protective film 108*b* can be formed within second interlayer insulating film 104*b*.

Insulating film 101 and interlayer insulating films 104, 104*a* and 104*b*, in the wiring examples of FIGS. 1(*a*) and 1(*b*), can be formed from various materials, including polyorganosiloxanes such as hydrogen silsesquioxane (HSQ), methyl silsesquioxane (MSQ) and the like, organic materials containing aromatics such as poly-arylether (PAE), divinylsiloxane-bis-benzocyclobutane (BCB), and SiLK (a trademark of the Dow Chemical Company), or the like, and low dielectric constant materials such as spin on glass (SOG), flowable oxide (FOX), parylene, Cytop (a trademark of Asahi Glass Company), and BCB, and the like. It is understood that in the case of HSQ, various constituents can be used, including so called "ladder" and/or "cage" constituents. Cross talk and the like can be suppressed by using such low dielectric films, and device reliability can be increased.

Preferably, an insulating film 101 and interlayer insulating films 104, 104*a* and 104*b* can be formed from materials having thermal expansion coefficients which are nearly equal to those of the metals constituting the wiring. This can effectively reduce stress migration of a connection plug and wirings. From this vantage point, when a copper containing metallic film is used as a metallic wiring, it can be preferable to use HSQ as an interlayer insulating film, for example.

Barrier metal films 102, 106, 106*a* and 106*b* in the wiring structures of FIGS. 1(*a*) and 1(*b*) can contain high melting point metals such as titanium (Ti), tungsten (W), tantalum (Ta), and the like, as but a few examples. Preferably, barrier metals can include Ti, titanium nitride (TiN), W, tungsten nitride (WN), Ta, tantalum nitride (TaN), and the like. In particular, tantalum barrier metals in which Ta and TaN are laminated in that order are preferably used. The barrier metal films can be formed by methods such as sputtering, chemical vapor deposition (CVD), and the like. A film thickness of a barrier metal film may be suitably set corresponding to the materials used, wiring structure, or the like. Such a thickness can be set to the order of 1 to 30 nm, for example.

Although not shown in FIGS. 1(*a*) and 1(*b*), a diffusion prevention film can also be suitably formed between insulating film 101 and interlayer insulating films 104 or 104*a*. A diffusion prevention film can prevent metals constituting the wiring and plug from diffusing into the insulating film. Further, such a film can provide the function of an etching prevention film (e.g., etching stop) for cases in which interlayer connection holes are formed in the wiring structure formation process. Examples of possible diffusion prevention films can include silicon carbide (SiC), silicon-carbon-nitrogen (SiCN), silicon nitride (SiN), fluorinated silicon oxide (SiOF), silicon oxynitride (SiON), and the like.

Various embodiments of the present invention will be explained in further detail below with reference to additional diagrams.

A first embodiment can include applying the present invention to a copper wiring according to a dual Damascene method, and will be described with reference to FIG. 2(*a*) to 3(*d*).

First, an insulating film 101 can be formed on a silicon substrate (not shown in the figures). A lower layer wiring made from a barrier metal film 102, a copper containing metallic film 103, and silver containing metallic protective film 108*a* can be formed within insulating film 101. It is noted that formation of a lower layer wiring can be accomplished by processes similar to the procedures described below.

After forming an interlayer insulating film 104 on insulating film 101, a connection hole can be formed in parts by multi-stage dry etching. This can form a wiring groove 105 having a T shape when viewed in cross section. A state of a semiconductor following the step is shown in FIG. 2(*a*).

Subsequently, a barrier metal film 106 can be formed on an entire substrate surface (FIG. 2(*b*)). Material constituting a barrier metal film 106 can contain a high melting point metal such as Ti, TiN, W, WN, Ta and TaN. Further, as discussed above, such a film can be a multi-layer film in which two or more films are laminated. A barrier metal film 106 can be formed by a method such as sputtering, CVD, or the like.

Subsequently, a seed metallic film 107 can be formed on barrier metal film 106 (FIG. 2(*c*)). Seed metallic film 107 can serve as a seed for growing a plating on an upper portion thereof. A copper containing metal can be used as such a seed metallic film 107. A seed metallic film 107 may normally be formed by sputtering.

Subsequently, a copper plating film 110 can be formed on the substrate surface by plating (FIG. 3(*a*)). In one approach, a normal plating solution can be used for such a plating step. As but one example, a copper plating solution can be an aqueous copper sulfate solution. It is preferable that a plating solution not contain chloride ions. More particularly, it is preferable to use a normal aqueous copper sulfate solution from which chloride ions have been removed, a pyrophosphate copper plating solution, an ethylenediamine copper plating solution, or the like. Such solutions can prevent reactions between chloride ions within copper plating film 110 and silver, and the precipitation of such an element in later process steps. This can lead to the formation of more stable silver containing metallic protective film 108*b*.

Subsequently, annealing is performed at a temperature range from 200° C. to 450° C. The diameter of copper grains constituting copper plating film 110 can become larger than before annealing. This can reduce resistance of the film in stable fashion.

Figure 3:
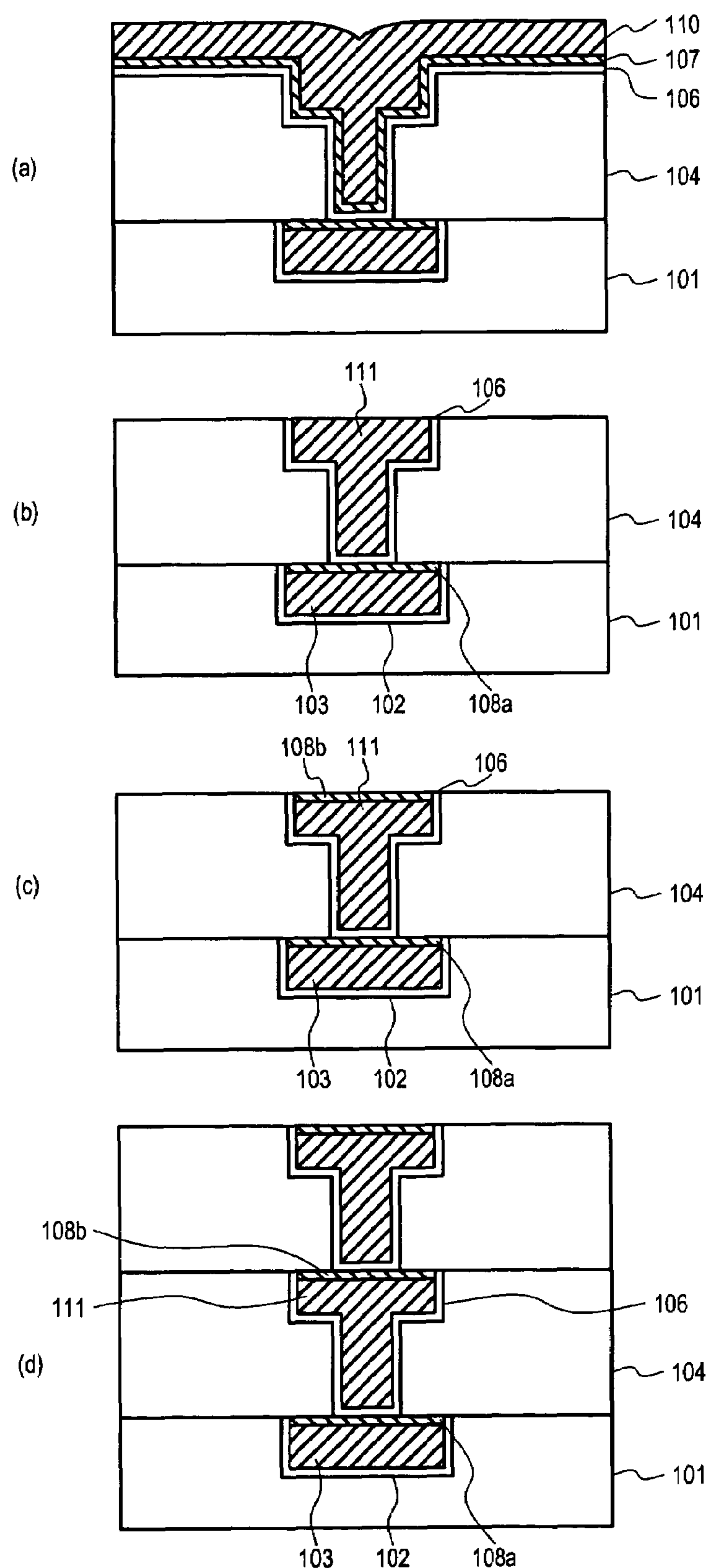
FIGS. 3(*a*) to 3(*d*) are cross sectional views showing a method of manufacturing a semiconductor device structure like that shown in FIG. 1(*b*).

After that, portions of copper plating film 110 outside the wiring groove can be removed by chemical mechanical polishing (CMP), and thus form copper containing metallic film 111 (FIG. 3(*b*)).

A silver containing liquid can then be contacted to the exposed surface to form a silver containing metallic protective film 108*b* on the surface of the copper containing metallic film 111 (FIG. 3(*c*)).

Silver has a lower deposition potential than copper, and is more electrochemically noble than copper. Therefore, an oxidation-reduction reaction can occur at the surface of copper containing metallic film 111, and silver containing metallic protective film 108*b* can be formed by silver precipitating out of the solution.

As but one example, it is preferable to use an aqueous silver sulfate solution, or the like, as a silver containing liquid. In one particular example, a concentration of such an aqueous silver sulfate solution can be set equal to or greater than 50 parts per million (ppm) by mass, and less than 30% by mass. Even more particularly, it is desirable that the silver containing solution be in a saturated or supersaturated state. Dissolution of copper can thus be suppressed, and distortions of the metallic regions and the like can be suppressed.

Silver can precipitate out on the copper containing metallic film 111 by contact with the silver containing liquid, and silver containing metallic protective film 108*b* can be formed within copper containing metallic film 111, as an alloy of copper and silver. At this point, it is preferable that the amount of silver in the silver containing metallic protective film 108*b* exceeds the solid solubility limit with respect to copper. It is noted that if the amount of silver exceeds the solid solubility limit with respect to copper, an intermetallic compound of silver and copper can be formed within silver containing metallic protective film 108*b*, and this can increase resistance to stress migration.

In this way, a wiring structure in which a silver containing metallic protective film 108*b* can be formed on the surface of a wiring, which wiring may be formed from a copper containing metallic film 111 can be obtained according to the above processes.

Further, after forming a silver containing metallic protective film 108*b*, an annealing can be performed at a temperature in the range from 200° C. to 450° C. Such an annealing can increase the size of silver grains within the silver containing metallic protective film 108*b*, which can reduce resistance of such a film in stable fashion. Annealing can be performed by lamp annealing for a relatively short time period, from 5 to 10 minutes. Silver can thus be dispersed essentially uniformly within the copper containing metallic film 111 in the vicinity of the interface between the silver containing metallic protective film 108*b* and the copper containing film 111. Precipitation strengthening can occur if an intermetallic compound between silver and copper is contained within the silver containing metallic protective film 108*b* at this point. Therefore, the strength of the silver containing metallic protective film 108*b* can be effectively increased. Further, a silver containing metallic protective film 108*b* can be formed in a region in which its thickness is equal to or less than approximately 60% of the total film thickness of the copper containing metallic film 111 and the silver containing metallic protective film 108*b*.

In accordance with the method shown above, an overall thickness of a resulting wiring layer can be maintained. An upper portion of copper containing metallic film 111 can be displaced by silver containing metallic protective film 108*b*. Therefore, a wiring can be formed that completely fills the dimensions of the wiring groove. Further, because silver containing metallic protective film 108*b* is formed by silver displacing copper on the surface of copper containing metallic film 111, silver containing metallic protective film 108*b* can be maintained at a same level. In addition, a displacement reaction can be automatically stopped if copper on the surface of a copper containing metallic film 111 is displaced by silver. Thus, such a displacement reaction can be controlled with good reproducibility, and such a wiring structure can be stably manufactured.

In accordance with the above mentioned method, an interface of wirings made from a copper containing metallic film, such as 103 or 111 can be protected by a silver containing metallic protective film 108*a* or 108*b* according to a relatively simple process. Further, as shown in FIG. 3(*d*), even in a multilayer wiring structure, a wiring structure having high resistance to stress migration can be stably formed. That is, a strength of the surface in which a wiring contacts a connection plug can be increased according to this method. Therefore, the development of a void (like that shown as 122*b* in FIG. 11(*b*) as a particular example) can be prevented, and resistance of the wiring to stress migration can be increased. Still further, deformation of an entire wiring can be suppressed as an upper portion of a wiring can be covered by a silver containing protective film, and therefore development of a void (like that shown as 122*a* in FIG. 11(*a*) as a particular example), can be reduced.

A second embodiment will now be described. A second embodiment can differ from the above first embodiment, in that the present invention is applied to a copper wiring according to a single Damascene method. This will be explained below with reference to FIG. 1(*b*). It is noted that the description of this second embodiment can include reference numerals that are essentially the same as the first embodiment. Accordingly, explanations of such features will be omitted.

First, an insulating film 101 can be formed on a silicon substrate (not shown in the figure). A lower layer wiring made from a barrier metal film 102, a copper containing metallic film 103, and a silver containing metallic protective film 108*a* can be formed within insulating film 101. Note that formation of a lower layer wiring can be manufactured by processes similar to those described below.

After forming a first interlayer insulating film 104*a* on insulating film 101, a connection hole (not shown in the figures) can be formed by dry etching. A barrier metal film 106*a* and a copper containing metallic film 111*a* can be formed on an entire surface of a substrate. The barrier metal film 106*a* and the copper containing metallic film 111*a* formed outside a connection hole can be removed by CMP.

A wiring groove (not shown in the figures) can be formed next by dry etching after forming a second interlayer insulating film 104*b* on the first interlayer insulating film 104*a*. The barrier metal film 106*b* and a copper containing metallic film 111*b* can be formed on an entire surface of a substrate. After performing annealing, the barrier metal film 106*b* and the copper containing metallic film 111*b* formed outside a wiring groove can be removed by CMP.

In this state, a silver containing liquid can be made to contact a substrate surface, to thereby form a silver containing metallic protective film 108*b* in the surface of the copper containing metallic film 111*b*. A wiring structure in which the silver containing metallic protective film 108*b* is formed on a surface of the copper containing metallic film 111*b* can be obtained by the above processes.

In accordance with the above method, an interface of a wiring made from the copper containing metallic film 103 and 111*b* can be protected by the silver containing metallic protective films 108*a* and 108*b* with a relatively simple process. As a result, a wiring structure having high resistance to stress migration can be stably formed.

That is, the strength of the surface in which a wiring contacts a connection plug can be increased according to this method, the development of a void (like that shown as 122*b* in FIG. 11(*b*) as a particular example) can be prevented, and resistance of the wiring to stress migration can be increased.

Further, in the present second embodiment, a copper containing metallic film can be separated into two portions, the connection plug portion 111*a* and the wiring portion 111*b* by the barrier metal film 106*b* disposed between the two. This can suppress deformation of an entire wiring, and developments of a void (like that shown as 122*a* in FIG. 11(*a*) as a particular example), can be reduced.

A third embodiment will now be described. A third embodiment can differ from the above first embodiment in that silver containing metallic protective films 108*a* and 108*b* can be formed with a plating solution containing copper and silver. A method of manufacturing a semiconductor device according to this embodiment will be described with reference to FIGS. 2(*a*) to 2(*c*) and 4(*a*) to 4(*d*).

Figure 2:
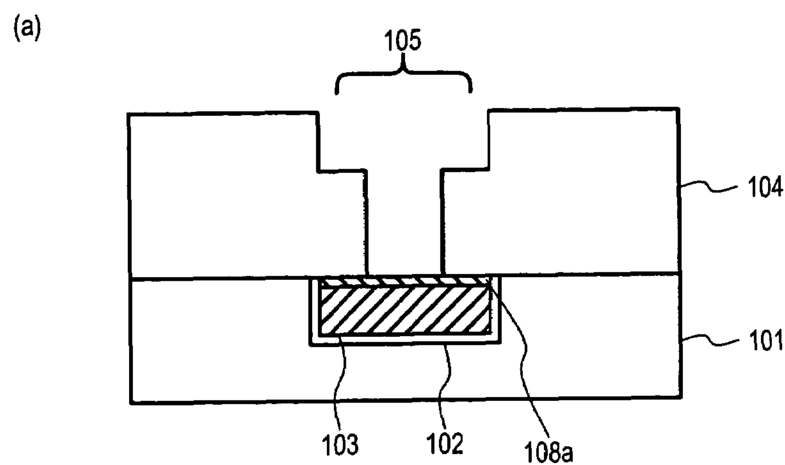
FIGS. 2(*a*) to 2(*c*) are cross sectional views showing a method of manufacturing a semiconductor device structure like that shown in FIG. 1(*a*).
Figure 2:
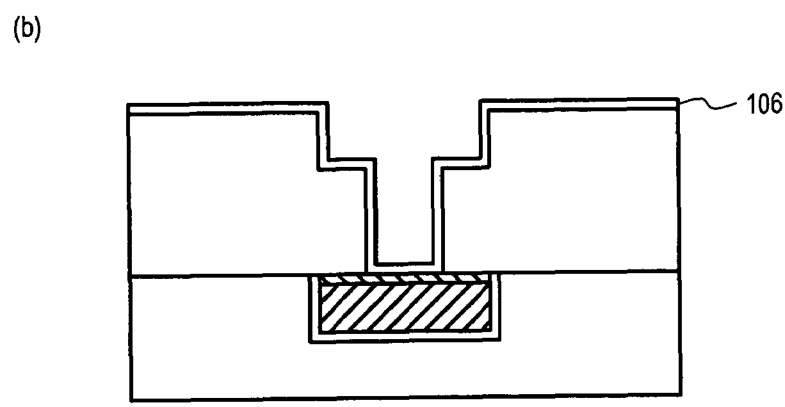
Figure 2:
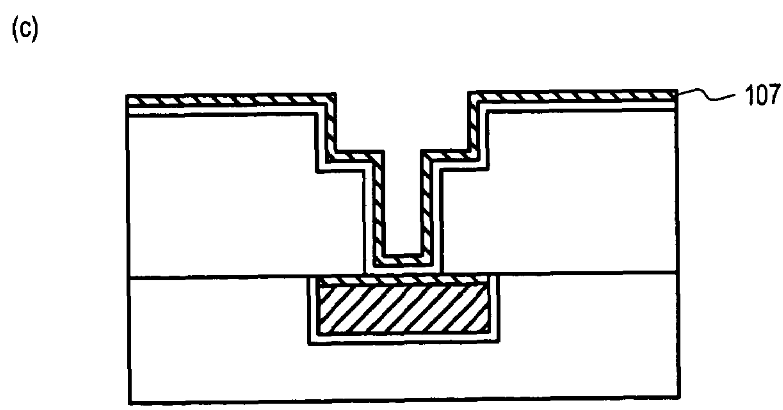

First, a seed metallic film 107 can be formed on a barrier metal film 106 by implementing processes from FIGS. 2(*a*) to 2(*c*) of the first embodiment. Subsequently, a copper plating film 110 can be formed on a substrate surface by a plating method (FIG. 4(*a*)). A plating solution for such a step can similar to that utilized in the formation of the copper plating film 110 of the first embodiment mode. Next, annealing can be performed at a temperature range of 200° C. to 450° C.

Subsequently, a silver containing plating film 112 can be formed on an upper portion of the copper plating film 110 by an electrolysis plating method using a plating solution containing copper and silver. Preferably, the amount of silver with respect to copper can be equal to or greater than 0.1% by mass, and equal to or less than 80% by mass.

The plating solution for forming the silver containing plating film 112 preferably contains essentially no chloride ions. If chloride ions are present within the plating solution, the precipitation of silver can become substantial in the plating solution. Thus, silver can precipitate out of solution before being incorporated into a film. This can make it difficult to stably form an alloy film of silver and copper.

The following are provided as specific examples of plating solution for forming the silver containing plating film 112.

(i) Pyrophosphate Plating Solution

A pyrophosphate plating solution containing copper and silver can be obtained by adding silver ions to a normal pyrophosphate copper plating solution. The addition of silver can be realized by a method such as adding a silver nitrate solution, a silver sulfate solution, or the like. A specific composition of such a plating solution can contain the following, as but one example:

0.01 to 5 moles (mol)/liter (L) copper,
0.01 to 5 mol/L silver,
0.01 to 5 mol/L pyrophosphate or its salt, and water (ii) Ethylenediamine Plating Solution An ethylenediamine plating solution containing copper and silver can be obtained by adding silver ions to a normal ethylenediamine copper plating solution. The addition of silver can be realized by a method such as adding a silver nitrate solution, a silver sulfate solution, or the like. A specific composition of such a plating solution can contain the following, as but one example:

0.01 to 5 moles (mol)/liter (L) copper,
0.01 to 5 mol/L silver,
0.01 to 5 mol/L ethylenediamine, and water Suitable additive agents can also be added to each of the aforementioned plating solutions. For example, surfactants can be added which can result in more uniform copper crystal sizes precipitating out of solution in the plating and/or for making the thickness of a plating film uniform. While no particular limitations on the amount of surfactant added are intended by the present invention, a surfactant amount can in the general range of 1 to 1000 ppm by mass with respect to the entire plating solution.

It is preferable that the plating solution contain substantially no chlorine. Specifically, it is preferable that the chlorine concentration be equal to or less than 0.01 milligrams (mg)/L. With such low concentrations of chlorine, silver can be effectively prevented from reacting with chlorine and precipitating out of solution. Thus, metallic film made from a copper-silver alloy can be stably formed.

Subsequently, annealing can be performed at a temperature range of about 200° C. to 450° C. Sizes of silver grains constituting a silver containing plating film 112 can become larger by such an annealing with respect to grain sizes prior to annealing. Thus, resistance can be lowered in a stable fashion. Such an annealing can be performed by lamp annealing for a relatively short period of time, such as 5 to 10 minutes.

Subsequently, a surface of a substrate can be planarized by CMP, thus forming a wiring structure made from a barrier metal film 106, a copper containing metallic film 111, and a silver containing metallic protective film 108*b*.

Figure 4:
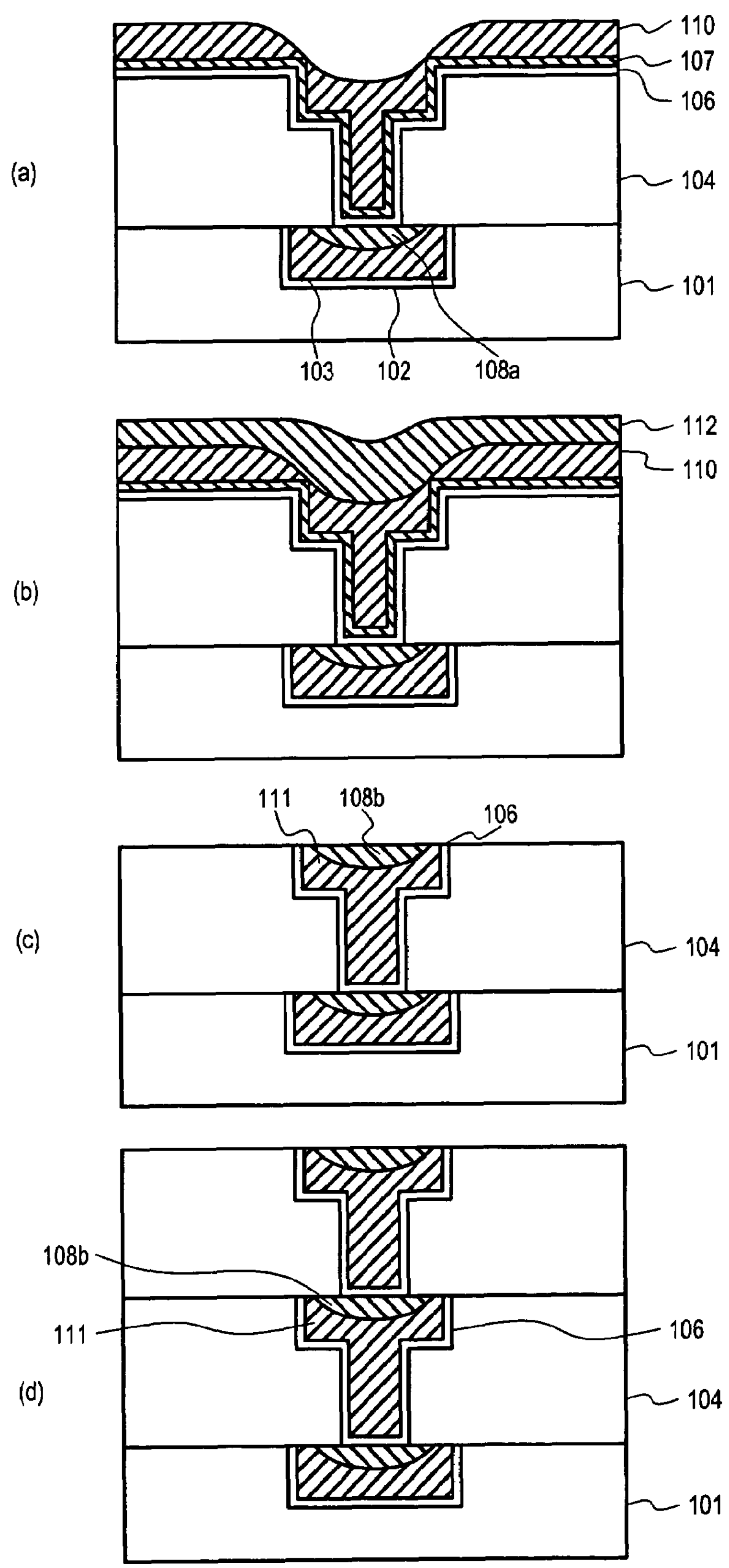
FIGS. 4(*a*) to 4(*d*) are cross sectional views showing a method of manufacturing a wiring structure according to another embodiment.

In accordance with the above method, an interface with the wiring made from a copper containing metallic film 111 can be protected by a silver containing metallic protective film 108*b* with relatively simple process steps. As shown in FIG. 4(*d*), the interface on an upper portion of a wiring with the connection plug can also be protected by the silver containing metallic protective film 108*b* in the case of a multi-layer wiring structure. Thus, a wiring structure having a high resistance to stress migration can be formed in a stable fashion.

It is understood that while a method of manufacturing a wiring structure according to a dual Damascene method has been shown by this embodiment, a similar wiring structure can be manufactured according to a single Damascene method. In such an arrangement, a barrier metal film is disposed between the connection plug and a top wiring top in accordance with the single Damascene method, thus a connection plug and wiring are separated into two portions. Therefore, the development of stress migration can be further suppressed.

Experimental Results for Embodiments are shown below.

Five test pieces, identified as A1 to A5, were prepared, and the resistance of each test piece was measured.

Test Piece A1: For this test piece, a wiring was manufactured according to a dual Damascene method similar to that shown in the first embodiment. Annealing was performed after formation of the silver containing metallic protective film 108*b* by lamp annealing for approximately 10 minutes. Silver was thus diffused in a region of approximately 20% of the average film thickness of the wiring. In addition, the average amount of silver in the region was approximately 2% by mass.

Test Piece A2: For this test piece, a wiring was manufactured according to a single Damascene method similar to that shown in the second embodiment. Annealing was performed after formation of the silver containing metallic protective film 108*b* by lamp annealing for approximately 10 minutes. Silver was thus diffused in a region of approximately 20% of the average film thickness of the wiring. In addition, the average amount of silver in the region was approximately 2% by mass.

Test Piece A3: For this test piece, a wiring was manufactured according to a dual Damascene method similar to that shown in the first embodiment. Annealing was performed after formation of the silver containing metallic protective film 108*b* by lamp annealing for approximately 30 minutes.

Silver was thus diffused in the entire wiring. In addition, the average amount of silver in the wiring was approximately 0.4% by mass.

Test Piece A4: For this test piece, a wiring was manufactured according to a dual Damascene method similar to that shown in the first embodiment. However, in this test piece the silver containing metallic protective film 108*b* was not formed.

Test Piece A5: For this test piece, a wiring was manufactured according to a dual Damascene method by a plating method. The plating method uses a plating solution containing silver and copper, but containing essentially no chloride ions. The amount of silver in the wiring was approximately 2% by mass.

The size of each test piece wiring was set to a width of 0.13 microns (μm) and a length of 40 millimeters (mm). Results of resistance measurements for such test pieces are shown in Table 1. The composition of the wirings was measured by secondary ion mass spectroscopy (SIMS).

TABLE 1

| Test Piece | Copper/Silver composition ratio (% by mass) | Silver containing region | Wiring formation method | Wiring resistance (kΩ) |
|---|---|---|---|---|
| A1 | 98/2 | Upper portion | Displacement plating (dual Damascene) | 30 |
| A2 | 98/2 | Upper portion | Displacement plating (single Damascene) | 30 |
| A3 | 99.6/0.4 | Distributed in entire wiring | Displacement plating (dual Damascene) | 33 |
| A4 | 100/0 | None | Plating by copper sulfate bath (dual Damascene) | 27 |
| A5 | 98/2 | Distributed in entire wiring | Plating by silver containing ethylenediamine bath (dual Damascene) | 41 |

The test pieces A1 and A2 have an amount of silver in wiring upper portions of 2% by mass. The test piece A3 has an amount of silver in the entire wiring of 0.4% by mass. Thus, the amount of silver in the entire wiring is essentially equal for test pieces A1 to A3. Further, the amount of silver in test piece A5 is 2% by mass.

A slight increase in resistance can be seen in the resistance values of test pieces A1 and A2 as compared to the piece A4, made entirely of copper. However, a lowering of resistance can be seen for test pieces A1 and A2 as compared to test piece A5, in which silver is diffused in the entire wiring. Further, although test pieces A1, A2 and A3 are all formed by a displacement plating method, the annealing time for test piece A3 can be relatively long. Therefore, the resistance value of test piece A3 as a whole can become higher because silver is diffused throughout the copper film.

Chain resistance experiments were also conducted.

Figure 5:
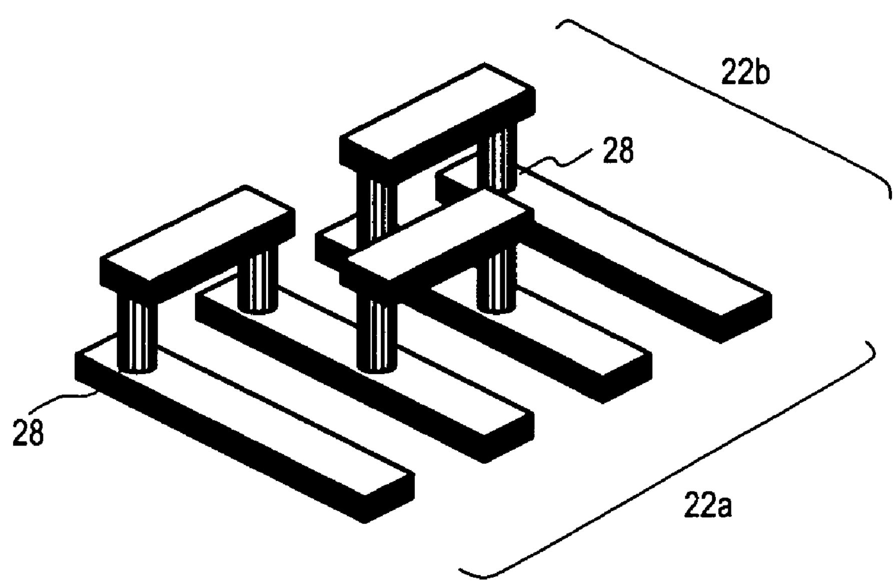
FIG. 5 is a diagram showing the principle of measuring via chain resistance.
Figure 6:
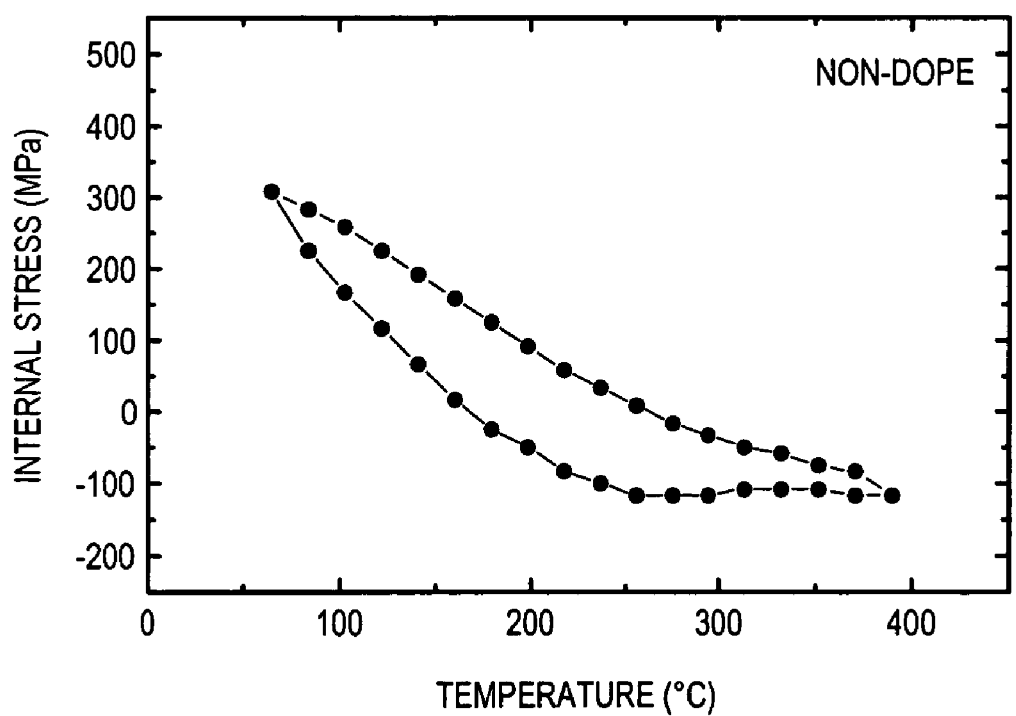
FIG. 6 is a graph showing hysteresis curve result measurements for one example.
Figure 7:
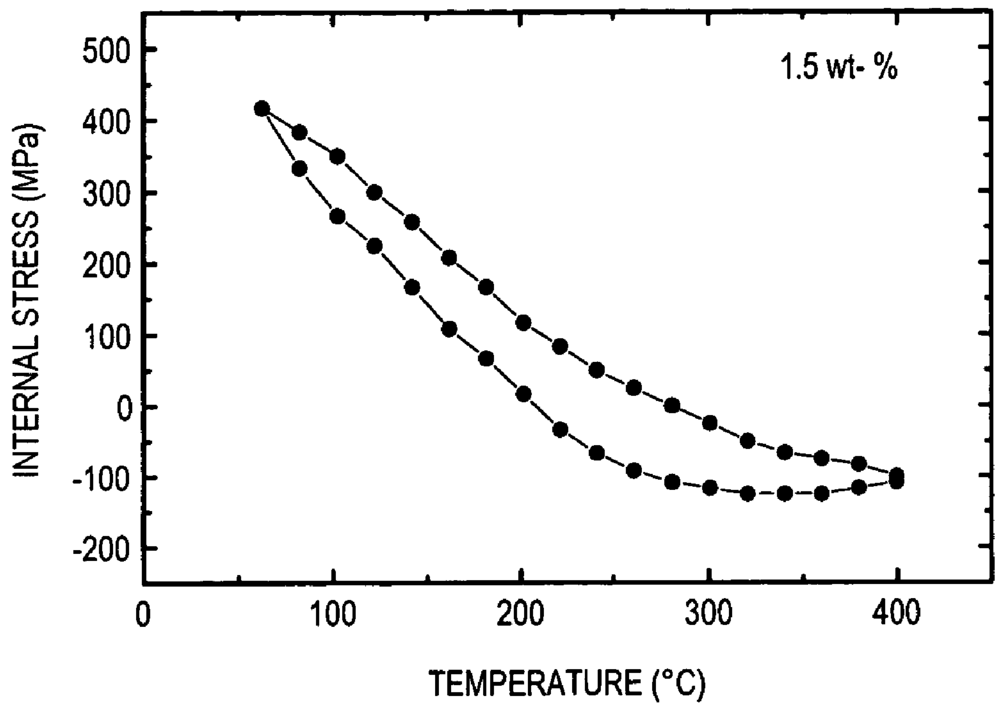
FIG. 7 is a graph showing hysteresis curve result measurements of another example.
Figure 8:
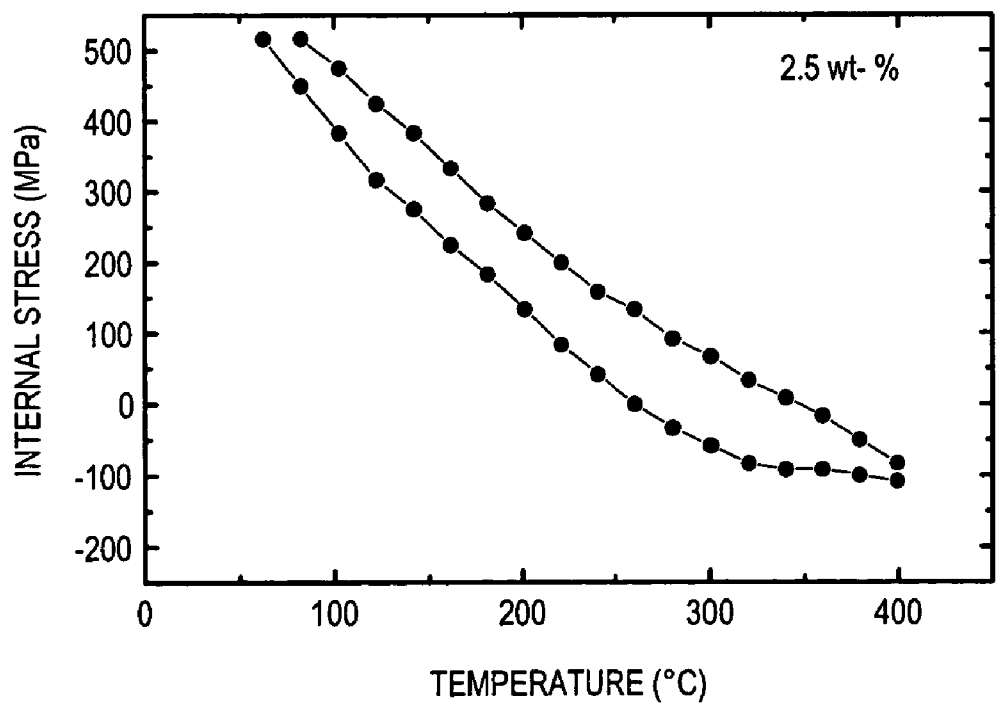
FIG. 8 is a graph showing hysteresis curve result measurements of another example.
Figure 9:
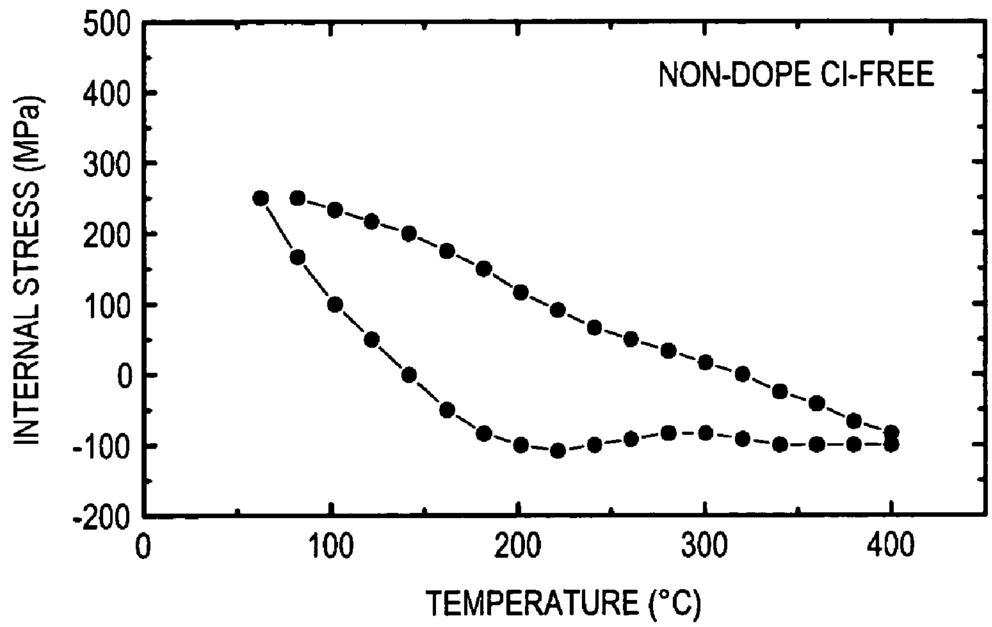
FIG. 9 is a graph showing hysteresis curve result measurements of another example.
Figure 10:
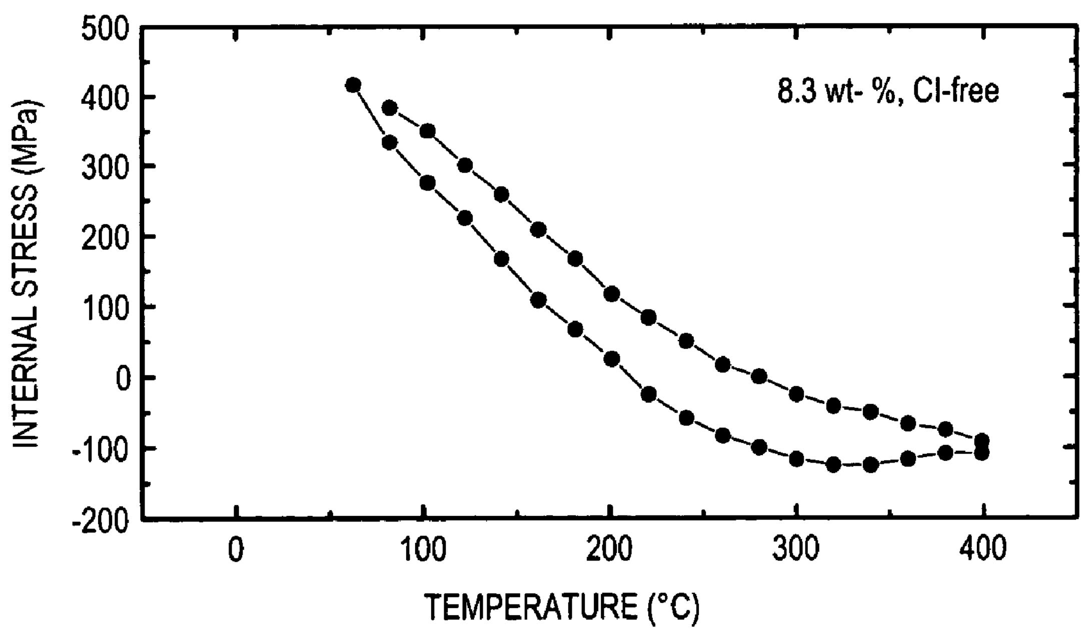
FIG. 10 is a graph showing hysteresis curve result measurements of another example.

A two-layer wiring structure shown in FIG. 5 was manufactured by a method similar to test piece A1 and A3-A5 and as shown in the first embodiment. A yield analysis was then performed. This two-layer wiring structure is referred to as a via chain. In such a via chain, 10,000 first wirings 22*a* are formed in parallel and 10,000 second wirings 22*b* are formed in parallel, orthogonal to the first wirings 22*a*. Connections between first and second wirings (22*a* and 22*b*) are made by 20,000 connection plugs 28. It is understood that a substrate, an interlayer insulating film, and the like, are omitted form FIG. 5.

Electrical resistance through the 10,000 first wirings 22*a*, the 10,000 second wirings 22*b*, and 20,000 connection plugs 28 was measured by applying a predetermined voltage at two ends of the via chain. This is referred to as chain resistance. The chain resistance measurement is a method that is effective in identifying the quality of the via connection state. The resistance to stress migration can be suitably evaluated by placing the wiring structure in an environment having a predetermined temperature, and measuring the chain resistance. Initial yields for chain resistance test piece samples A1 and A3 to A5 are shown in Table 2. The initial yield refers to the proportion of samples showing a resistance value equal to or less than a fixed value, when such samples are formed as a plurality of chips on a wafer. Results of initial yields for test piece samples A1 and A3 to A5 are shown in Table 2. The initial yields for test piece sample A4 was set to 100%.

TABLE 2

| Test Piece | Copper/Silver composition ratio (% by mass) | Silver containing region | Wiring formation method | Initial Yield (%) |
|---|---|---|---|---|
| A1 | 98/2 | Upper portion | Displacement plating (dual Damascene) | 90-100 |
| A3 | 99.6/0.4 | Distributed in entire wiring | Displacement plating (dual Damascene) | 74-92 |
| A4 | 100/0 | None | Plating by copper sulfate bath (dual Damascene) | 100 |
| A5 | 98/2 | Distributed in entire wiring | Plating by silver containing ethylenediamine bath (dual Damascene) | 70-90 |

As shown above, the yield of test piece samples A1, in which the silver containing protective film is formed only in an upper portion of the wiring, has a good initial yield when compared with test piece samples A3 and A5, in which the silver is diffused throughout the entire wiring. Further, even in comparison with the initial yield of test piece samples A4, which is formed of only copper, almost no loss in yield is seen. It is believed that this demonstrates that an increase in residual stress can be kept to a minimum for cases in which the silver containing protective film is formed in an upper portion of the wiring.

Further, the test piece A1 and the test pieces A3 to A5 were exposed for 500 hours to a temperature of 150° C. The via chain yield experiment readings were taken once again afterward.

TABLE 3

| Test Piece | Copper/Silver composition ratio (% by mass) | Silver containing region | Wiring formation method | Initial (Relative Value) |
|---|---|---|---|---|
| A1 | 98/2 | Upper portion | Displacement plating (dual Damascene) | 86-100 |
| A3 | 99.6/0.4 | Distributed in entire wiring | Displacement plating (dual Damascene) | 70-90 |
| A4 | 100/0 | None | Plating by copper sulfate bath (dual Damascene) | 42-60 |

TABLE 3-continued

| Test Piece | Copper/Silver composition ratio (% by mass) | Silver containing region | Wiring formation method | Initial (Relative Value) |
|---|---|---|---|---|
| A5 | 98/2 | Distributed in entire wiring | Plating by silver containing ethylenediamine bath (dual Damascene) | 88-100 |

Resistance values for the test pieces were calculated as relative values for each test piece sample, with initial values of the via chain resistance taken as 100%. Ranges of resistance values are shown in the table, and these show resistance ranges obtained as a result of preparing test piece samples and evaluating them. The higher the value was, the higher the resistance to stress migration was.

As shown in Table 3, similar yields were obtained for the test piece samples A1 and A5. This shows that the silver composition ratio in an upper portion of the wiring can be effective for resistance to stress migration. Further, as can be seen in the results of test piece samples A1 and A3, it can be found that a yield drops if a composition ratio of silver in the upper portion of the wiring is low, even though the amount of silver contained in the entire wirings is substantially uniform.

From the above results, it can thus be verified that stress migration can be effectively suppressed by protecting the surface of wirings formed of copper by using the silver containing metallic protective film. As described above, in accordance with the present invention, increases in resistance and residual stress caused by forming an alloy can be kept to a minimum, and resistance to stress migration can be increased.

Comparative Example 1 is shown below.

The relationship between the content ratio of silver with respect to all metals constituting a wiring, and resistance to stress migration can be verified by comparative example. A two-layer wiring structure shown in FIG. 5, was manufactured according to various embodiments. A yield experiment is then performed.

Test pieces for this example were manufactured by a dual Damascene method. The above test pieces were exposed for 500 hours under a temperature of 150° C. after being manufactured. A via chain yield experiment was then performed. A test piece B1 in this example is the same as test piece A4 in the previous example. Further, a test piece B3 is the same as the test piece A5 in the previous example.

TABLE 4

| Test Piece | Copper/Silver composition ratio (% by mass) | Wiring formation method | Yield (Relative Value) |
|---|---|---|---|
| B1 | 100/0 | Plating by copper sulfate bath | 42-60 |
| B2 | 99.95/0.05 | Plating by silver containing ethylene-diamine bath | 60-81 |
| B3 | 98/2 | Plating by silver containing ethylene-diamine bath | 88-100 |

Table 4 shows the resistance values of the test pieces B1 to B3 as relative values to an initial value of test piece B1, which was set as 100%. Ranges of resistance values are shown in the table, and represent resistance ranges obtained by testing a number of the above test pieces. The higher the yield value, the higher the resistance to stress migration.

From the results of this second comparative example, it can be verified that resistance to stress migration can be effectively increased by increasing a content ratio of silver with respect to a wiring made from a silver-copper alloy. In particular, such advantageous features can be achieved by increasing the amount of silver with respect all other metals constituting the wiring. Further, the results also show that stress migration can be effectively suppressed for cases in which the content ratio of silver with respect to all metals constituting a wiring is greater than 1% by mass, which is the solid solubility limit of silver with respect to copper.

Comparative Example 2 is shown below.

In comparative example 2, hysteresis characteristics and recrystallization temperatures of copper films and copper-silver alloy films were measured.

Test pieces for this example were manufactured as follows. First, a silicon oxide film having thickness of 500 nm was formed by plasma CVD on a silicon substrate. A Ta film having thickness of 50 nm was formed thereon. Next, a plating seed film made from copper was formed thereon at a thickness of 100 to 200 nm by sputtering. After, a copper film or a copper-silver alloy film was formed at a thickness of about 600 to 700 nm using a predetermined plating solution. The compositions of the copper and copper-silver alloy films are shown in Table 5. Note that a "plating solution 1" contains chloride ions, and a "plating solution 2" does not contain chloride.

Test pieces manufactured as described above were subjected to a thermal cycle of 25° C. to 400° C. The increasing rate of temperature of the heating process for the thermal cycle was set to 10° C./minute, and the decreasing rate of temperature during a cooling process for the thermal cycle was set to approximately 10° C./minute. The thermal cycle was run two times, and hysteresis characteristics were evaluated when imparting the second thermal cycle.

If it is taken into account that growth of particles constituting the plating film occur during the first thermal cycle, and that that evaluating the stability of a plating film with respect to actual usage conditions and thermal processes during manufacture is important, evaluating hysteresis after a second thermal cycle can be considered suitable for determining the hysteresis characteristics of the film.

It is also noted that in this second comparative example, recrystallization temperature was measured when imparting the second thermal cycle.

When characterizing hysteresis, a method can be used that calculates internal stress of a plating film by measuring a curvature of a substrate. A substrate curvature can be calculated by measuring a reflection angle of a laser light that is irradiated onto the surface of the substrate. A hysteresis width and a recrystallization temperature were found from the hysteresis characteristics thus measured (the temperature stress curve when imparting the second thermal cycle).

Results are shown in Table 5. Further, hysteresis curves for a portion of the test pieces are shown in FIG. 6 to FIG. 10. Results for test pieces C1 can correspond to FIG. 6. Results for, test pieces C2 can correspond to FIG. 9. Results for test pieces C4 can correspond to FIG. 7. Results for test pieces C5 can correspond to FIG. 8. Results for test pieces C6 can correspond to FIG. 10.

TABLE 5

| Test Piece | Copper/Silver composition ration (% by mass) | Wiring formation method | Hysteresis width (MPa) | Recrystallization temperature (° C.) |
|---|---|---|---|---|
| C1 | 100/0 | Plating by copper sulfate bath | 210 | 150 |
| C2 | 100/0 | Plating by ethylene-diamine bath | 160 | 170 |
| C3 | 99/1 | Plating by silver containing ethylene-diamine bath (Plating solution 1) | 150 | 190 |
| C4 | 98.5/1.5 | Plating by silver containing ethylene-diamine bath (Plating solution 1) | 120 | 220 |
| C5 | 97.5/2.5 | Plating by silver containing ethylene-diamine bath (Plating solution 1) | 100 | 250 |
| C6 | 91.7/8.3 | Plating by silver containing ethylene-diamine bath (Plating solution 2) | 80 | 240 |

As understood from the above results, a recrystallization temperature can become higher and a hysteresis width can be reduced substantially if an amount of silver with respect to all metals constituting a wiring is greater than 1% by mass. This type of improvement in hysteresis can be considered a reason why the characteristics of test piece B3 in comparative example 1 is good.

As explained above, a semiconductor device can have superior reliability with high resistance to stress migration, and the like, can be provided in accordance with the present invention. This is because the surface of a metallic region of a wiring structure, or the like, can be protected by a metal having a high recrystallization temperature and/or a metal having a narrow hysteresis width in its temperature-stress curve. Further, processes for stably manufacturing a semiconductor device according to the present invention are disclosed.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:

a semiconductor substrate;

an insulating layer formed on the semiconductor substrate;

a copper wiring embedded in the insulating layer and having a bottom surface opposing the semiconductor substrate and a top surface opposite to the bottom surface;

a protective layer embedded in the insulating layer and in contact with a substantially entire surface of the top surface of the copper wiring, the protective layer being made entirely of an alloy of copper and silver; and a connection plug having bottom surface formed in contact with a top surface of the protective layer and a top surface of the connection plug opposite the bottom surface of the connection plug, the connection plug having a side surface connecting the bottom surface of the connection plug to the top surface of the connection plug wherein at least a portion of the side surface of the connection plug being free from contacting the protective layer.

2. The semiconductor device according to claim 1, wherein:

the copper wiring contains therein at least one metallic material other than copper.

3. The semiconductor device according to claim 1, wherein:

the alloy of copper and silver includes a ratio of silver with respect to copper of less than or equal to 80% by mass.

4. The semiconductor device according to claim 1, wherein:

the alloy of copper and silver includes a ratio of silver with respect to copper of greater than or equal to 0.1% by mass.

5. A semiconductor device, comprising:

a semiconductor substrate;

a first insulating layer formed on the semiconductor substrate;

a copper wiring embedded in the insulating layer and having bottom, top and side surfaces, the bottom surface opposing the semiconductor substrate, the top surface being opposite to the bottom surface, and a side surface connecting the bottom surface to the top surface;

a protective layer embedded in the insulating layer and in contact with a substantially entire surface of the top surface of the copper wiring, the protective layer being made entirely of an alloy of copper and silver, the protective layer being free from contacting the bottom surface;

a second insulating layer formed on a first part of the protective layer so as to contact with a top surface of the protective layer; and a connection plug formed on a second part of the protective layer in contact with the top surface of the protective layer.

6. The semiconductor device according to claim 5, wherein:

the protective layer is free from contacting said side surface of the copper wiring.

7. The semiconductor device according to claim 6, further comprising:

a baffler layer contacting the bottom and side surfaces of the copper wiring.

8. The semiconductor device according to claim 6, further comprising:

a connection plug formed in contact with a top surface of the protective layer.

9. The semiconductor device according to claim 6, further comprising:

a barrier layer intervening between a top surface of the protective layer and a connection plug.

10. A semiconductor device having a damascene copper wiring structure, the damascene copper wiring structure comprising:

an insulating layer having a substantially planer upper surface;

a trench selectively formed in the insulating layer;

a copper-based material filling in the trench to a level that is lower than the upper surface of the insulating layer to form a recess with respect to the upper surface of the insulating layer; and a protective layer completely filling in the recess and being made entirely of an alloy of copper and silver.

11. The semiconductor device according to claim 10, wherein:

a top surface of the protective layer is substantially coplanar with the upper surface.

12. The semiconductor device according to claim 10, wherein:

the protective layer is in contact with a substantially entire surface of a top surface of the copper-based material.

* * * * *